US006377498B1

United States Patent
Kang

(10) Patent No.: US 6,377,498 B1
(45) Date of Patent: Apr. 23, 2002

(54) NONVOLATILE FERROELECTRIC MEMORY DEVICE WITH ROW REDUNDANCY CIRCUIT AND METHOD FOR RELIEVING FAILED ADDRESS THEREOF

(75) Inventor: Hee Bok Kang, Daejeon-si (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/662,595

(22) Filed: Sep. 14, 2000

(30) Foreign Application Priority Data

Sep. 15, 1999  (KR) ............................................ 99-39596

(51) Int. Cl.[7] ................................................ G11C 7/00
(52) U.S. Cl. ........................ 365/200; 365/145; 365/201; 365/230.03; 365/230.06; 365/225.7
(58) Field of Search ........................ 365/145, 65, 200, 365/201, 230.06, 230.03, 225.7

(56) References Cited

U.S. PATENT DOCUMENTS

| | | | | |
|---|---|---|---|---|
| 4,873,664 A | | 10/1989 | Eaton, Jr. ................... 365/145 |
| 5,581,508 A | * | 12/1996 | Sasaki et al. ............... 365/200 |
| 5,596,563 A | * | 1/1997 | Koh ........................... 365/200 |
| 5,618,742 A | * | 4/1997 | Shone et al. ................ 438/263 |
| 5,680,344 A | | 10/1997 | Seyyedy ...................... 365/145 |
| 5,764,587 A | * | 6/1998 | Buettner et al. ........ 365/230.06 |
| 6,058,053 A | * | 5/2000 | Tsuji et al. .................. 365/200 |
| 6,084,807 A | * | 7/2000 | Choi ........................... 365/200 |
| 6,240,007 B1 | * | 5/2001 | Kang .......................... 365/145 |

* cited by examiner

Primary Examiner—Hoai V. Ho
(74) Attorney, Agent, or Firm—Fleshner & Kim, LLP

(57) ABSTRACT

A nonvolatile ferroelectric memory device with a row redundancy circuit and method for relieving a failed address thereof, can relieve a row address failed in a main cell area and can reduce a layout size of a redundancy circuit. The nonvolatile ferroelectric memory device with row redundancy circuit can include a main cell area having first and second cell array portions each with a plurality of cell arrays, first and second local wordline drivers to respectively drive the first and second cell array portions, and a main wordline driver that outputs a control signal for activating any one of the first and second local wordline drivers of the main cell area. A redundancy cell area has first and second redundancy cell array portions each with a plurality of cell arrays and first and second redundancy local wordline drivers to correct errors generated when a row address of the main cell area is selected. A row redundancy driving circuit outputs an inactive signal to the main wordline driver responsive to the row address errors and outputs a control signal to the first and second redundancy local wordline drivers of the redundancy cell area. A single local decoder applies a driving signal, which will be applied to first and second split wordlines corresponding to any cell of the main cell area and the redundancy cell area, to the first and second local wordline drivers of the main cell area or the redundancy cell area.

20 Claims, 20 Drawing Sheets

NONVOLATILE FERROELECTRIC MEMORY DEVICE WITH ROW REDUNDANCY CIRCUIT AND METHOD FOR RELIEVING FAILED ADDRESS THEREOF

BACKGROUND OF THE INVENTION

1. Field of the Invention

The present invention relates to a semiconductor memory device, and more particularly, to a nonvolatile ferroelectric memory device with a row redundancy circuit and method for using same.

2. Background of the Related Art

Generally, a nonvolatile ferroelectric memory, i.e., a ferroelectric random access memory (FRAM) has a data processing speed equal to a dynamic random access memory (DRAM) and retains data even in power off. For this reason, the nonvolatile ferroelectric memory has received much attention as a next generation memory device.

The FRAM and DRAM are memory devices with similar structures, but the FRAM includes a ferroelectric capacitor having a high residual polarization characteristic. The residual polarization characteristic permits data to be maintained even if an electric field is removed.

FIG. 1 shows hysteresis loop of a general ferroelectric. As shown in FIG. 1, even if polarization induced by the electric field has the electric field removed, data is maintained at a certain amount (i.e., d and a states) without being erased due to the presence of residual polarization (or spontaneous polarization). A nonvolatile ferroelectric memory cell is used as a memory device by corresponding the d and a states to 1 and 0, respectively.

A related art nonvolatile ferroelectric memory device will now be described. FIG. 2 shows unit cell of a related art nonvolatile ferroelectric memory.

As shown in FIG. 2, the related art nonvolatile ferroelectric memory includes a bitline B/L formed in one direction, a wordline W/L formed to cross the bitline, a plate line P/L spaced apart from the wordline in the same direction as the wordline, a transistor T1 with a gate connected with the wordline and a source connected with the bitline, and a ferroelectric capacitor FC1. A first terminal of the ferroelectric capacitor FC1 is connected with a drain of the transistor T1 and second terminal is connected with the plate line P/L.

The data input/output operation of the related art nonvolatile ferroelectric memory device will now be described. FIG. 3a is a timing chart illustrating the operation of the write mode of the related art nonvolatile ferroelectric memory device, and FIG. 3b is a timing chart illustrating the operation of read mode thereof.

During the write mode, an externally applied chip enable signal CSBpad is activated from high state to low state. At the same time, if a write enable signal WEBpad is applied from high state to low state, the write mode starts. Subsequently, if address decoding in the write mode starts, a pulse applied to a corresponding wordline is transited from low state to high state to select a cell.

A high signal in a certain period and a low signal in a certain period are sequentially applied to a corresponding plate line in a period where the wordline is maintained at high state. To write a logic value "1" or "0" in the selected cell, a high signal or low signal synchronized with the write enable signal WEBpad is applied to a corresponding bitline.

In other words, a high signal is applied to the bitline, and if the low signal is applied to the plate line in a period where the signal applied to the wordline is high, a logic value "1" is written in the ferroelectric capacitor. A low signal is applied to the bitline, and if the signal applied to the plate line is high, a logic value "0" is written in the ferroelectric capacitor.

The reading operation of data stored in a cell by the above operation of the write mode will now be described. If an externally applied chip enable signal CSBpad is activated from high state to low state, all of bitlines become equipotential to low voltage by an equalizer signal EQ before a corresponding wordline is selected.

Then, the respective bitline becomes inactive and an address is decoded. The low signal is transited to the high signal in the corresponding wordline according to the decoded address so that a corresponding cell is selected.

The high signal is applied to the plate line of the selected cell to destroy data corresponding to the logic value "1" stored in the ferroelectric memory. If the logic value "0" is stored in the ferroelectric memory, the corresponding data is not destroyed.

The destroyed data and the data that is not destroyed are output as different values by the ferroelectric hysteresis loop, so that a sensing amplifier senses the logic value "1" or "0". In other words, if the data is destroyed, the "d" state is transited to an "f" state as shown in hysteresis loop of FIG. 1. If the data is not destroyed, "a" state is transited to the "f" state. Thus, if the sensing amplifier is enabled after a set time has elapsed, the logic value "1" is output in case that the data is destroyed while the logic value "0" is output in case that the data is not destroyed.

As described above, after the sensing amplifier outputs data, to recover the data to the original data, the plate line becomes inactive from high state to low state at the state that the high signal is applied to the corresponding wordline.

FIG. 4 is a block diagram showing the related art nonvolatile ferroelectric memory device, FIG. 5 is a schematic diagram showing a unit of the related art nonvolatile ferroelectric memory device, and FIG. 6 is a diagram that shows partial detail of FIG. 5.

A driving circuit of the related art nonvolatile ferroelectric memory device will now be described with reference to FIGS. 4–6.

As shown in FIG. 5, the related art nonvolatile ferroelectric memory is provided with a main wordline driver 1, a first cell array 2 on one side of the main wordline driver 1, a first local wordline driver 3 on one side of the first cell array 2, a second local wordline driver 4 on one side of the first local wordline driver 3 and a second cell array 5 on one side of the second local wordline driver 4. A first local X decoder 6 is formed over the first local wordline driver 3, and a second local X decoder 7 is formed over the second local wordline driver 4. The first local wordline driver 3 is adapted to receive a signal from the main wordline driver 1 and a signal from the first local X decoder 6 and selects a wordline for the first cell array unit 2. The second local wordline driver 4 is adapted to receive a signal from the main wordline driver 1 and a signal from the second local X decoder 7 and selects a wordline for the second cell array 5. The related art nonvolatile ferroelectric memory provides a signal from the main wordline driver 1 both to the first and second local wordline drivers 3 and 4. Therefore, one of the first and second cell arrays 2 and 5 is selected depending on signals from the first local X decoder 5 and the second local X decoder 6. That is, either the first cell array 2 or the second cell array 5 is selected, and a wordline of the selected cell array is driven depending on signals from the first and second local X decoders 6 and 7.

FIG. 6 is a diagram that illustrates selection of one of the cell arrays depending on signals from the first and second local X decoders 6, 7 of FIG. 5. As shown in FIG. 6, the main wordline connected to the main wordline driver 1 is formed across the first and second local wordline drivers 3 and 4 and the first and second cell arrays 2 and 5. The first local wordline driver 3 is a NAND logic gate 8a for subjecting a signal from the main wordline driver 1 received through the main wordline and a signal from the first local X decoder 6 to an logical operation. An output of the logic gate 8a and logic gate 8b, which is also a NAND gate, is dependent on signals from the first and second local X decoders 6 and 7 regardless of the signal provided from the main wordline driver 1. For example, if it is assumed that a high signal is provided from the main wordline driver 1, the first cell array 2 is selected if a signal from the first local X decoder 6 is low and a signal from the second local X decoder 7 is high. Opposite to this, if a signal from the first local X decoder 6 is high and a signal from the second local X decoder 7 is low, the second cell array 5 is selected. Thus, selection of either of the first and second cell arrays is dependent on the signals from the first and second local X decoders 6 and 7. As described above, the circuits for driving a nonvolatile ferroelectric memory shown in FIGS. 5–6 are limited repeatable portions. Thus, there are a plurality of first and second local wordline drivers 3 and 4, the first and second cell arrays 2 and 5, and first and second local X decoders 6 and 7 in the related art nonvolatile ferroelectric memory of FIG. 4.

In the related art nonvolatile ferroelectric memory device of FIG. 4, when the row address fails, the main wordline driver 1, the first local X decoder 6 and the second local X decoder 7 are all driven to relieve the failed address.

As described above, the related art nonvolatile ferroelectric memory device has various disadvantages. First, when the row address fails, it is necessary to drive a main wordline driver, a first local X decoder and a second local X decoder at the same time so as to relieve the failed address, which reduces relief efficiency. Since the local X decoders corresponding to the first and second local wordline drivers are required, the memory requires a large area. The two local X decoders required for selection of either one of the left or right cell array occupy a large area. Such an area increase, even if the area should become smaller according to the trend of high density device packing, causes delays that drop an access speed and deteriorate a driving performance. Further, an increase in chip size is not favorable for device packing or cost.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a nonvolatile ferroelectric memory device with a row redundancy circuit and method for relieving a failed address thereof that substantially obviates one or more of the problems due to limitations and disadvantages of the related art.

Another object of the present invention is to provide a nonvolatile ferroelectric memory device with a row redundancy circuit and method for relieving a failed address thereof having a reduced layout.

Another object of the present invention is to provide a nonvolatile ferroelectric memory device with a row redundancy circuit and method for relieving a failed address thereof that only uses a row redundancy circuit and a single local decoder when a main cell address fails.

Another object of the present invention is to provide a nonvolatile ferroelectric memory device with a row redundancy circuit and method for relieving a failed address thereof, suitable for efficient relief of a row address failed in a main cell area and for efficient layout of a relieving circuit.

To achieve at least these objects and other advantages in a whole or in part and in accordance with purposes of the present invention, as embodied and broadly described, a nonvolatile ferroelectric memory device with a row redundancy circuit according to the present invention includes a main cell area having first and second cell array portions each with a plurality of cell arrays, and first and second local wordline drivers arranged between the first and second cell array portions to output a driving signal for any one of cells of the first and second cell array portions, a main wordline driver that outputs a control signal to activate any one of the first and second local wordline drivers of the main cell area, a redundancy cell area having first and second redundancy cell array portions for relieving errors generated when a row address of the main cell area is selected and first and second redundancy local wordline drivers, a row redundancy driving circuit that outputs an inactive signal to the main wordline driver when errors are generated in selecting the row address of the main cell area and outputs a control signal to the first and second redundancy local wordline drivers of the redundancy cell area and a local decoder that applies the driving signal to one of the first and second local wordline drivers of the main cell area and the redundancy cell area corresponding to first and second split wordlines of a selected cell of the main cell area and the redundancy cell area.

To further achieve the above objects in a whole or in parts, and in accordance with purposes of the present invention, there is provided a nonvolatile ferroelectric memory device that includes a main cell array including first and second memory arrays each having a plurality of cell arrays, first and second local wordline drivers between the first and second memory arrays that respectively output a driving signal for cells of the first and second memory arrays, a main wordline driver that provides a main control signal to activate one of the first and second local wordline drivers, a redundancy cell array including first and second redundancy memory arrays each having a plurality of cell arrays, wherein the redundancy cell array corrects an error generated when a row address of the main cell array is selected, first and second redundancy local wordline drivers that respectively output the driving signal for cells in the first and second redundancy memory arrays, a row redundancy driving circuit that provides an inactive signal to the main wordline driver when the error is generated for the selected the row address of the main cell array and a redundancy control signal to the first and second redundancy local wordline drivers, and a decoder that provides the driving signal corresponding to any cell of the main cell array and the redundancy cell array to one of the first and second local wordline drivers of the main cell array and the first and second redundancy local wordline drivers of the redundancy cell array.

To further achieve the above objects in a whole or in parts, and in accordance with purposes of the present invention, there is provided a row redundancy circuit for a memory device that includes a failed address coder that codes a failed address in a main cell area to generate a correction signal, a detector that detects the correction signal generated by the failed address coder to output a redundant address signal, an active signal generator that generates a redundant control signal in first and second redundancy local wordline drivers of a redundancy cell area responsive to the redundant address signal, and an inactive signal generator that provides an inactive signal for the main cell array responsive to the redundant address signal.

To further achieve the above objects in a whole or in parts, and in accordance with purposes of the present invention, there is provided a method for relieving a failed address of a nonvolatile ferroelectric memory device with a row redundancy circuit, wherein the nonvolatile ferroelectric memory has a main cell array and a redundant cell array that includes performing chip test after a wafer fabrication process, detecting a failed address of a main cell array, generating a relief address active signal by disabling an address fuse so that a failed address coder codes a corresponding address responsive to the failed address, detecting the relief address active signal and transmitting a relief address signal to a corresponding active signal generator and inactive signal generator, generating a redundant control signal for activating first and second local wordline drivers of the redundancy cell array from the relief address signal so as to activate a redundant split wordline driver and generating a driving signal in the first and second local wordline drivers of the redundancy cell area and at the same time generating an inactive signal for the main cell array.

It is to be understood that both the foregoing general description and the following detailed description are exemplary and explanatory and are intended to provide further explanation of the invention as claimed.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
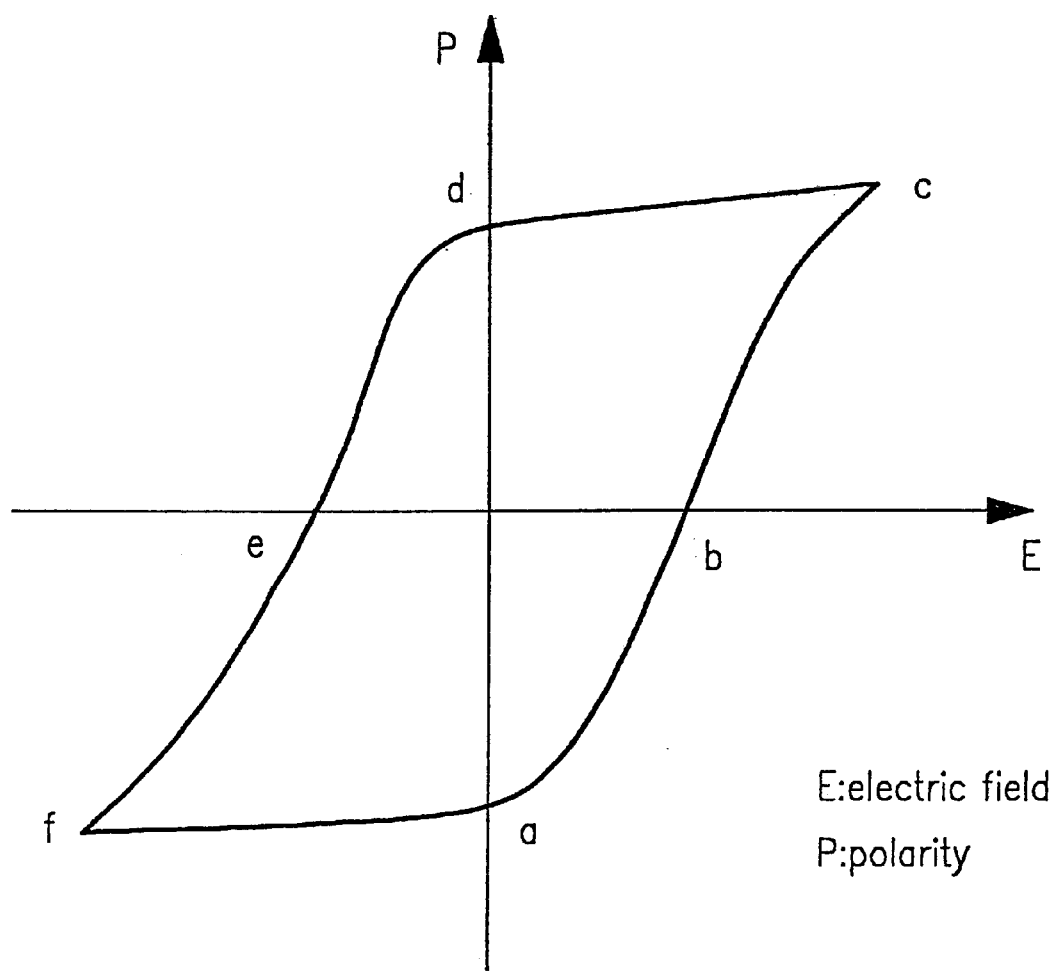
FIG. 1 illustrates a hysteresis loop of a ferroelectric material.
Figure 2:
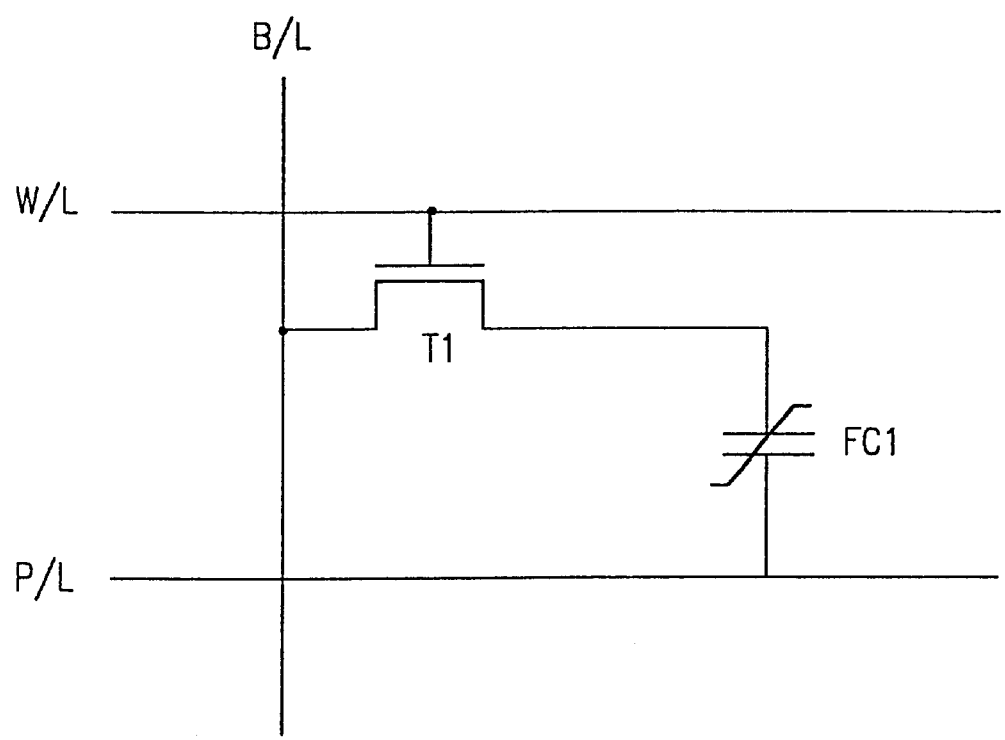
FIG. 2 is a schematic diagram that illustrates an unit cell of a related art non-volatile ferroelectric memory.
Figure 3A:
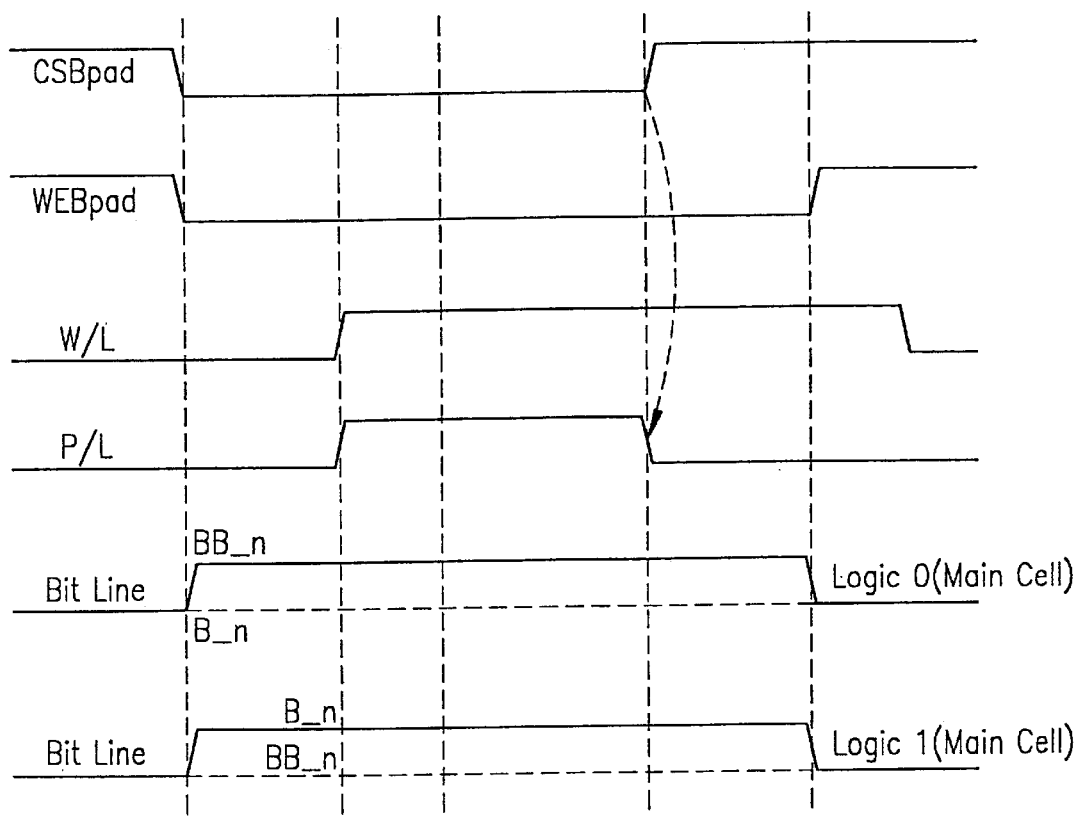
FIG. 3a illustrates a timing diagram of a write mode operation of the related art nonvolatile ferroelectric memory.
Figure 3B:
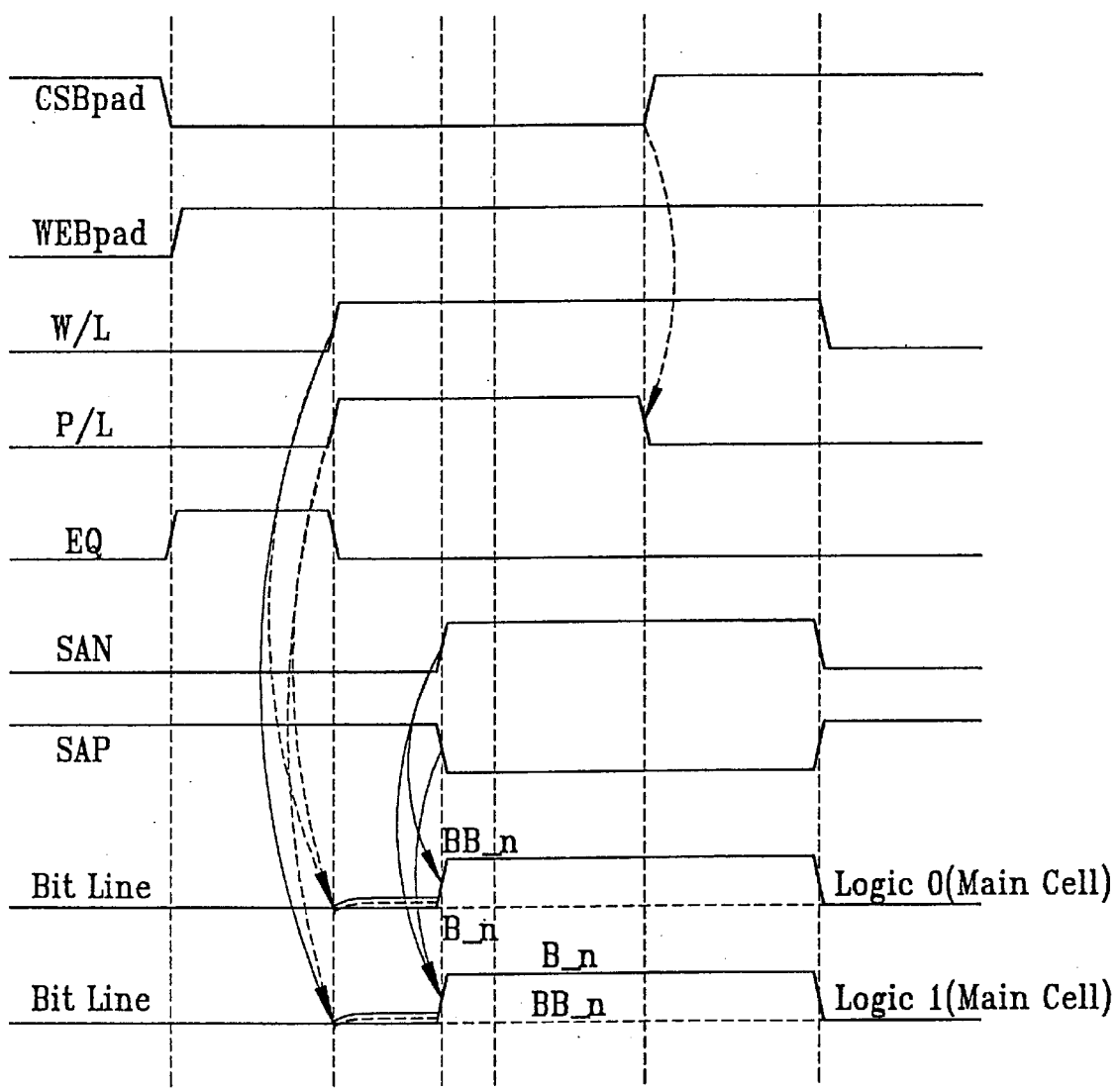
FIG. 3b illustrates a timing diagram of a read mode operation of the related art nonvolatile ferroelectric memory.
Figure 4:
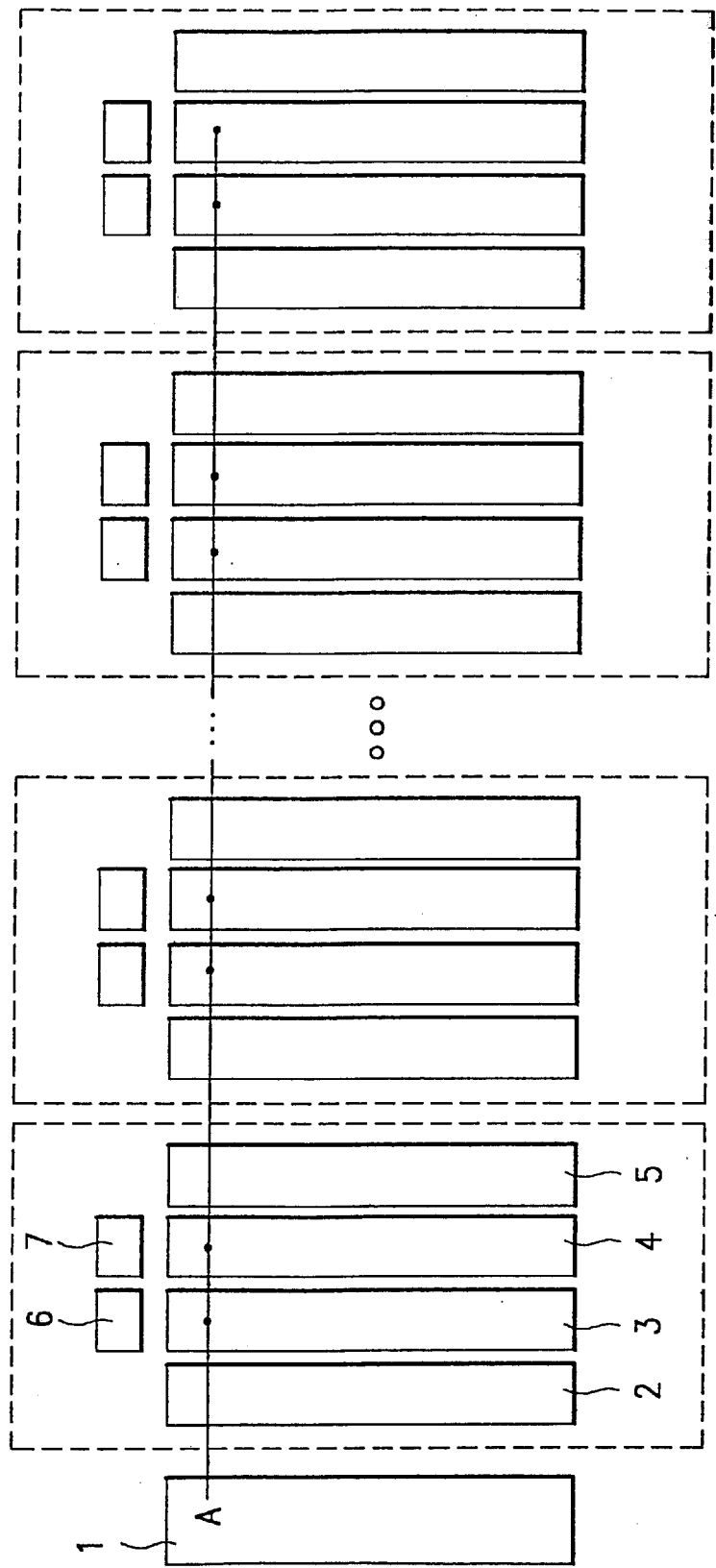
FIG. 4 is a block diagram that illustrates a related art nonvolatile ferroelectric memory device.
Figure 5:
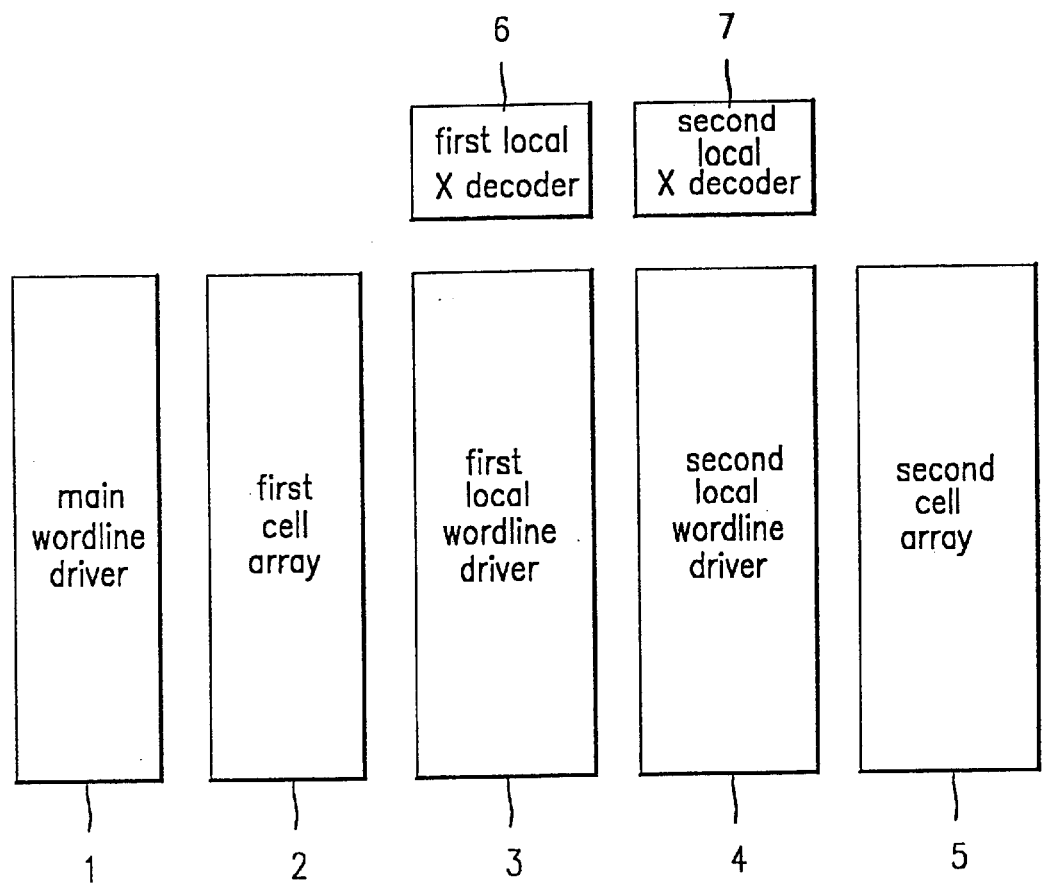
FIG. 5 illustrates a block diagram of a memory array of a related art nonvolatile ferroelectric memory device.
Figure 6:
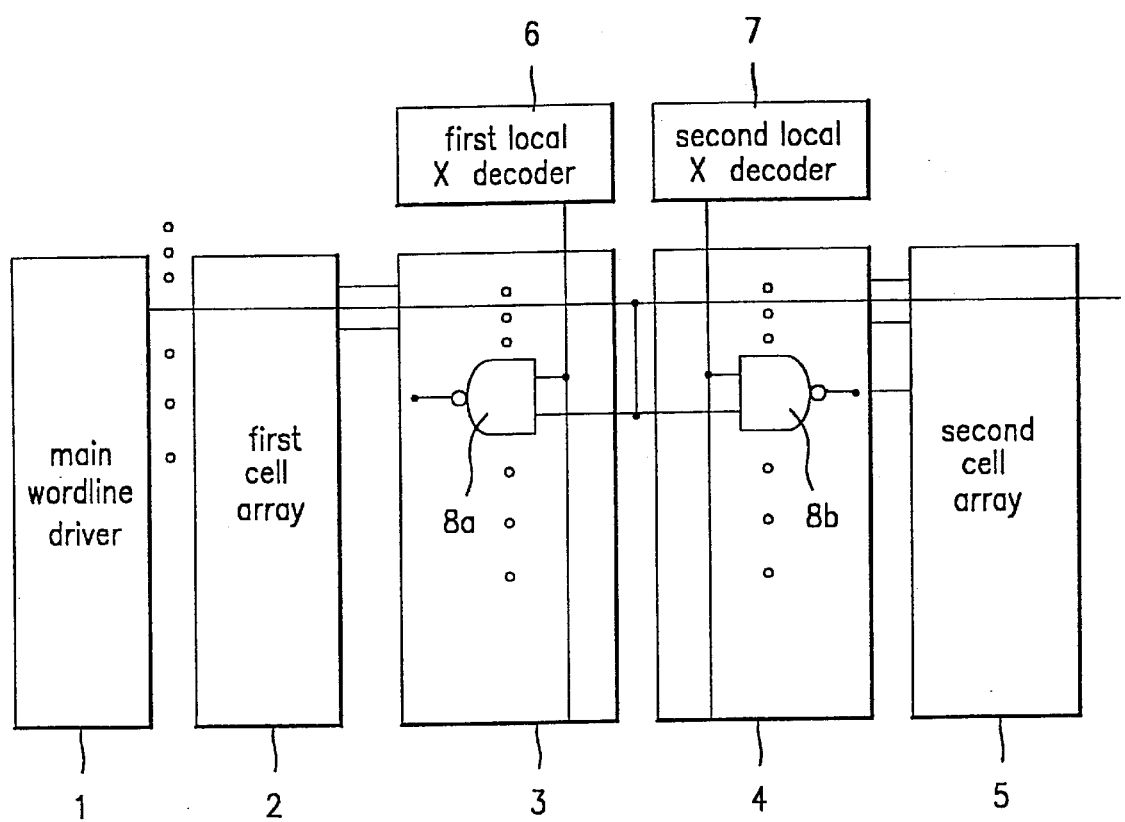
FIG. 6 illustrates a partial detail of a related art nonvolatile ferroelectric memory of FIG. 4.
Figure 7:
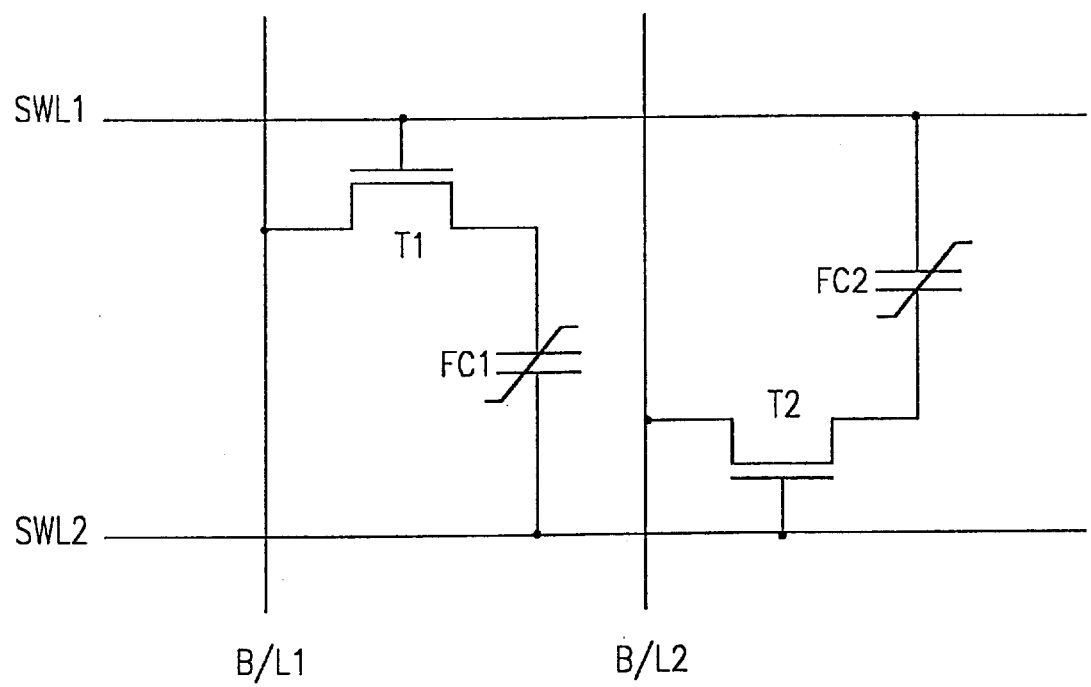
FIG. 7 is a diagram that illustrates a unit cell of a nonvolatile ferroelectric memory according to preferred embodiments of the present invention.

FIG. 7 is a schematic view showing a unit cell of a nonvolatile ferroelectric memory device according to preferred embodiments of the present invention. As shown in FIG. 7, a unit cell of the nonvolatile ferroelectric memory device includes first and second split wordlines SWL1 and SWL2 formed with a prescribed interval in a row direction, and first and second bitlines B/L1 and B/L2 formed across the first and second split wordlines SWL1 and SWL2. A first transistor T1 has a gate coupled with the first split wordline SWL1 and drain coupled with the first bitline B/L1. A first ferroelectric capacitor FC1 is coupled between a source of the first transistor T1 and the second split wordline SWL2. A second transistor T2 has a gate coupled with the second split wordline SWL2 and drain coupled with the second bitline B/L2, and a second ferroelectric capacitor FC2 is coupled between a source of the second transistor T2 and the first split wordline SWL1. A plurality of the unit cells make a cell array.

In view of data storage, the unit cell can include a pair of split wordlines, a bitline, a transistor 1T, and a ferroelectric capacitor 1C. The unit cell can also include a pair of split wordlines, two bitlines, two transistors 2Ts, and two ferroelectric capacitors 2FCs.

Figure 8:
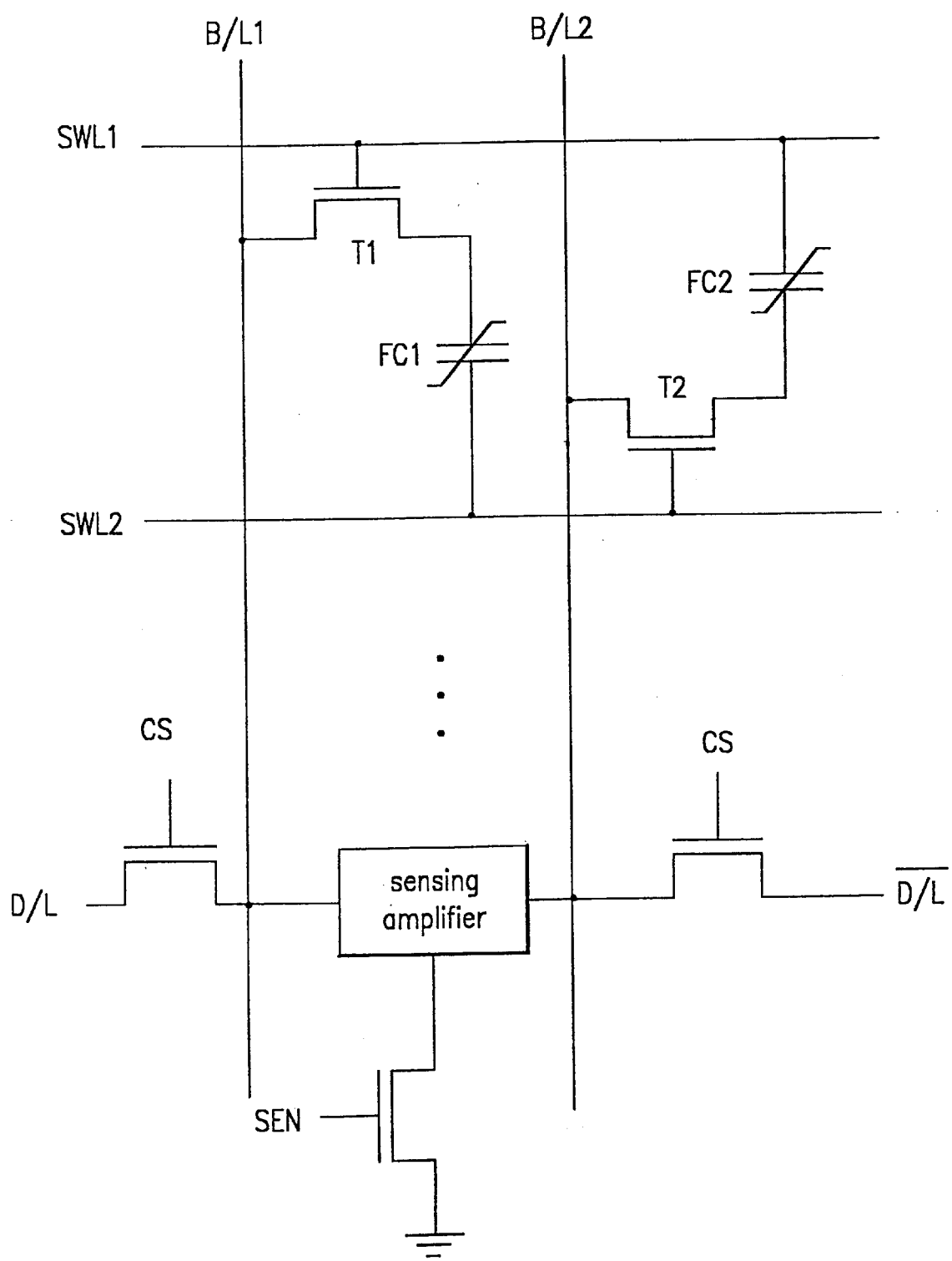
FIG. 8 is a circuit diagram that illustrates an output portion of a nonvolatile ferroelectric memory according to preferred embodiments of the present invention.

FIG. 8 is a circuit diagram showing portions of a nonvolatile ferroelectric memory device according to preferred embodiments of the present invention. As shown in FIG. 8, a plurality of split wordline pairs each including first and second split wordlines SWL1 and SWL2 in pairs are preferably formed in row direction. A plurality of bitline pairs B/Ln and B/Ln+1 (e.g., B/L1 and B/L2) are formed across the split wordline pairs. Sensing amplifiers are formed between the respective bitline pairs to sense data transmitted through the bitlines and transfer the sensed data to a data line DL or a data bar line /DL. In addition, a sensing amplifier enable portion and a selection switching portion are provided. The sensing amplifier enable portion outputs a sensing amplifier enable signal SEN to enable the sensing amplifiers SA, and the selection switching portion selectively switches bitlines and data lines and can use a column selection signal CS.

Operations of a nonvolatile ferroelectric memory device according to preferred embodiments of the present invention will be described with reference to a timing chart shown in FIG. 9.

Figure 9:
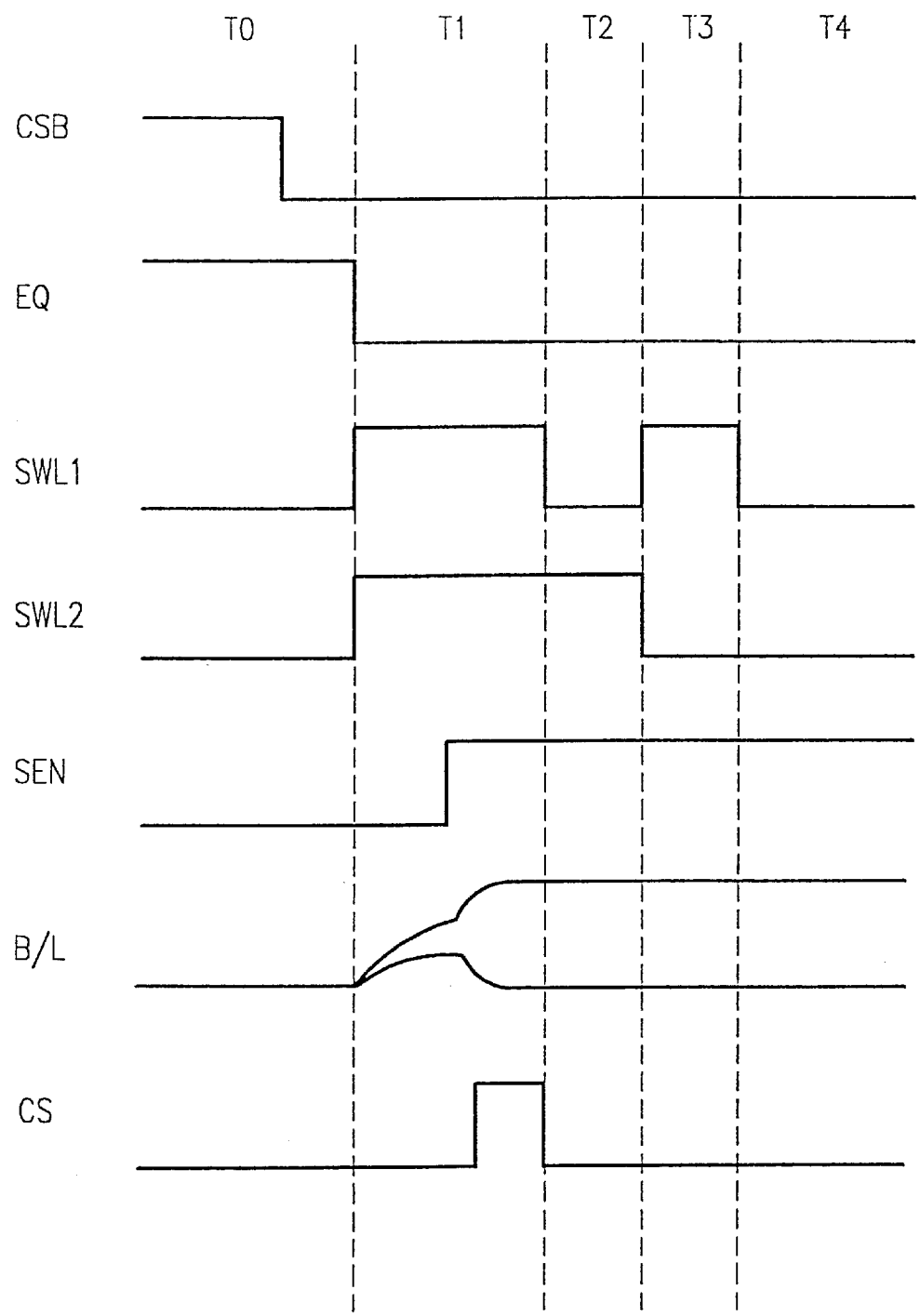
FIG. 9 illustrates a timing diagram showing operations of a nonvolatile ferroelectric memory according to preferred embodiments of the present invention.

A T0 period in FIG. 9 denotes a period before the first split wordline SWL1 and the second split wordline SWL2 are activated to "high (H)". In this T0 period, all of bitlines are preferably precharged at a level.

A T1 period denotes a period that the first and second split wordlines SWL1 and SWL2 are all to become high level "H". In this T1 period, data of the ferroelectric capacitor in the main cell are transmitted to a bitline so that the bitline level is varied.

At this time, in case of the ferroelectric capacitor having a logic value "high", since electric fields having opposite polarities are applied to the bitline and the split wordline, the polarity of the ferroelectric is destroyed so that a large amount of current flows. Thus, a high voltage in the bitline is induced. By contrast, in case of the ferroelectric capacitor having a logic value "low", since electric fields having the same polarities are applied to the bitline and the split wordline, polarity of the ferroelectric is not destroyed so that a small amount of current flows. Thus, a low voltage is induced in the bitline.

If the cell data are loaded in the bitline sufficiently, the sensing amplifier enable signal SEN is transited to high so as to activate the sensing amplifier. As a result, the bitline level is amplified.

Since the logic data "H" of the destroyed cell can not be restored at the state that the first and second split wordlines SWL1 and SWL2 are high, the data can be restored in later T2 and T3 periods. Subsequently, in T2 period, the first split wordline SWL1 is transited to low, the second split wordline SWL2 is maintained at high level, and the second transistor T2 is turned on. At this time, if the corresponding bitline is high, high data is transmitted to one electrode of the second ferroelectric capacitor FC2 so that the logic value "1" is restored.

In T3 period, the first split wordline SWL1 is transited to high, the second split wordline SWL2 is transited to low, and the first transistor T1 is turned on. At this time, if the corresponding bitline is high, high data is transmitted to one electrode of the first ferroelectric capacitor FC1 so that logic value "1" is restored.

Figure 10:
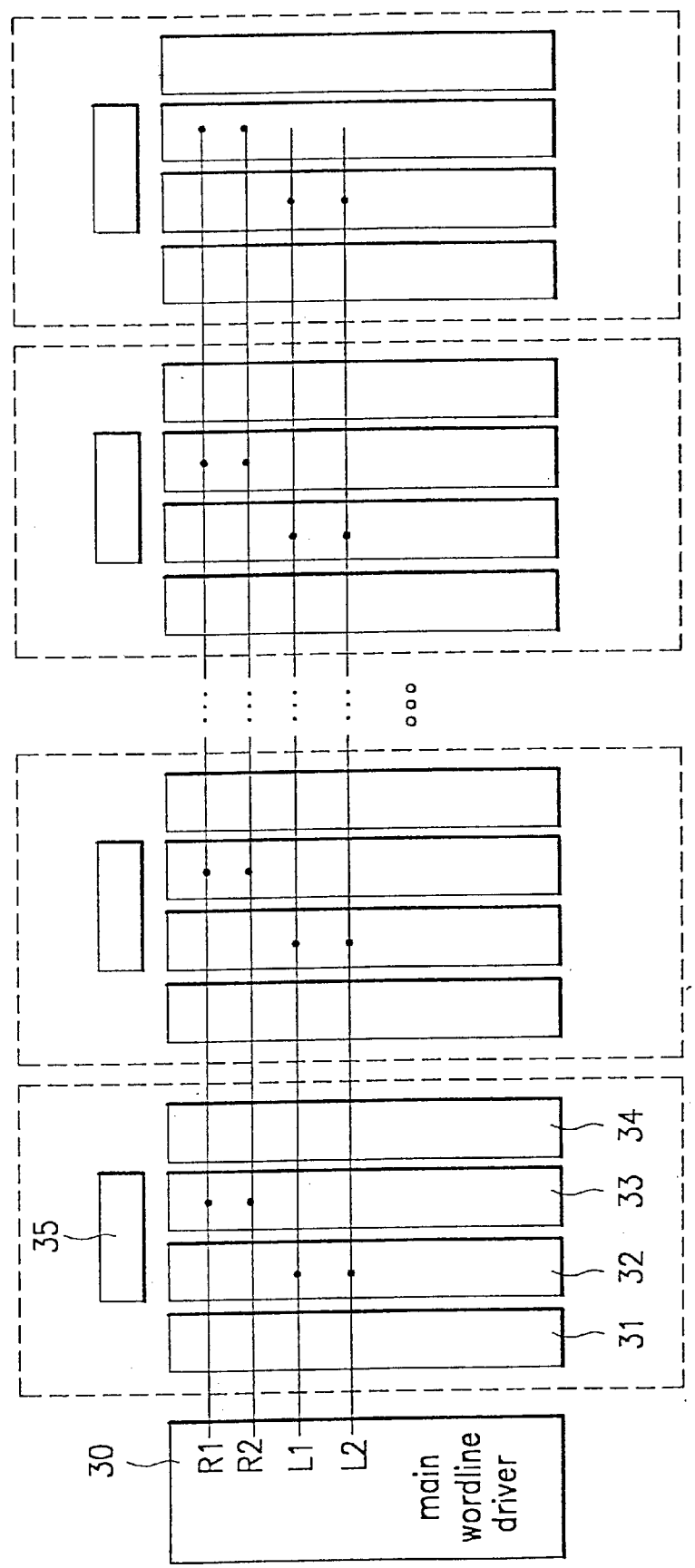
FIG. 10 is a block diagram showing a nonvolatile ferroelectric memory device according to preferred embodiments of the present invention.
Figure 11:
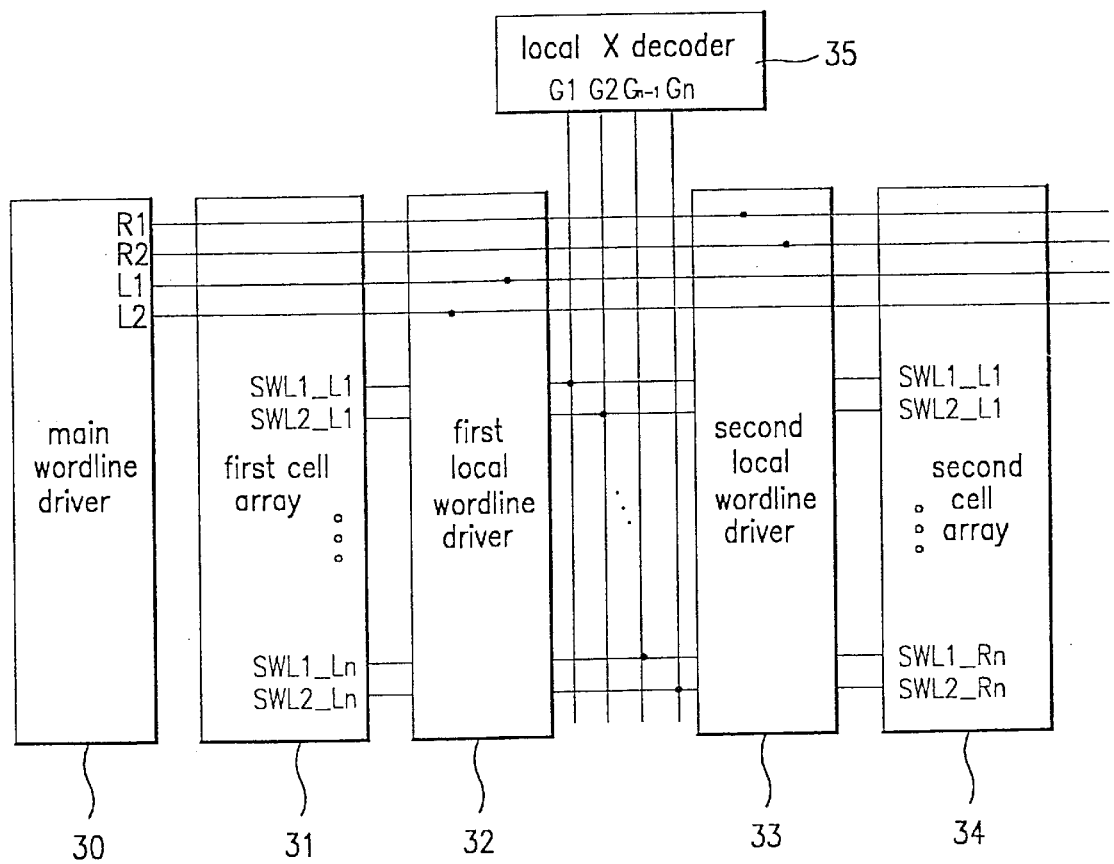
FIG. 11 is a schematic view showing a unit of FIG. 10.

FIG. 10 is a block diagram showing a nonvolatile ferroelectric memory device according to preferred embodiments of the present invention. FIG. 11 is a schematic view of a section of FIG. 10.

As shown in FIG. 11, a unit of the nonvolatile ferroelectric memory device includes a main wordline driver 30, a first cell array 31 on one side of the main wordline driver 30 having a plurality of cell arrays, a first local wordline driver 32 on one side of the first cell array 31 having a plurality of local wordline drivers, at a second local wordline driver 33 on one side of the first local wordline driver 32 having a plurality of local wordline drivers, a second cell array 34 on one side of the second local wordline driver 33 having a plurality of cell arrays, a first local X decoder 35 is preferably formed above (or below) the first and second local wordline drivers 32 and 33. The main wordline driver 30 provides first and second control signals for enabling one of the first and second local wordline drivers 32 and 33 and third and fourth control signals for disabling the other one.

The enabling first and second control signals may be R1 and R2 or L1 and L2. In other words, if the R1 and R2 are the first and second control signals, the L1 and L2 are the third and fourth control signals. Alternatively, if the L1 and L2 are the first and second control signals, the R1 and R2 are then the third and fourth control signals. However, the present invention is not intended to be so limited.

When the first and second control signals are R1 and R2, respectively, the second local wordline driver unit 33 is preferably enabled. When the first and second control signals are L1 and L2, respectively, the first local wordline driver unit 32 is preferably enabled. The first and the second control signals preferably have opposite phases. However, the present invention is not intended to be so limited. Each of the first and second cell arrays 31 and 34 includes cell arrays each having a plurality of unit cells each with two transistors and two ferroelectric capacitors as shown in FIG. 7.

The first local X decoder unit 35 provides control signals G1, ..., Gn corresponding to the split wordlines, and the control signals are also provided to the first and second local wordline driver units 32 and 33. The main wordline driver 30 provides a control signal for controlling the first local wordline driver unit 32 and the second local wordline driver unit 33. The main wordline driver 30 preferably provides a control signal for selecting either one of the first local wordline driver unit 32 and the second wordline driver unit 33. The local wordline driver selected by the control signal is preferably enabled to provide an enable signal from the local X decoder to a desired split wordline pair that corresponds to at least one selected cell.

As shown in FIG. 10, one main wordline driver 30 preferably includes a plurality of sets. Each set preferably includes the first and second cell arrays 31 and 34, the first and second local wordline drivers 32 and 33 and the first local X decoder 35. However, the present invention is not intended to be so limited.

Figure 12:
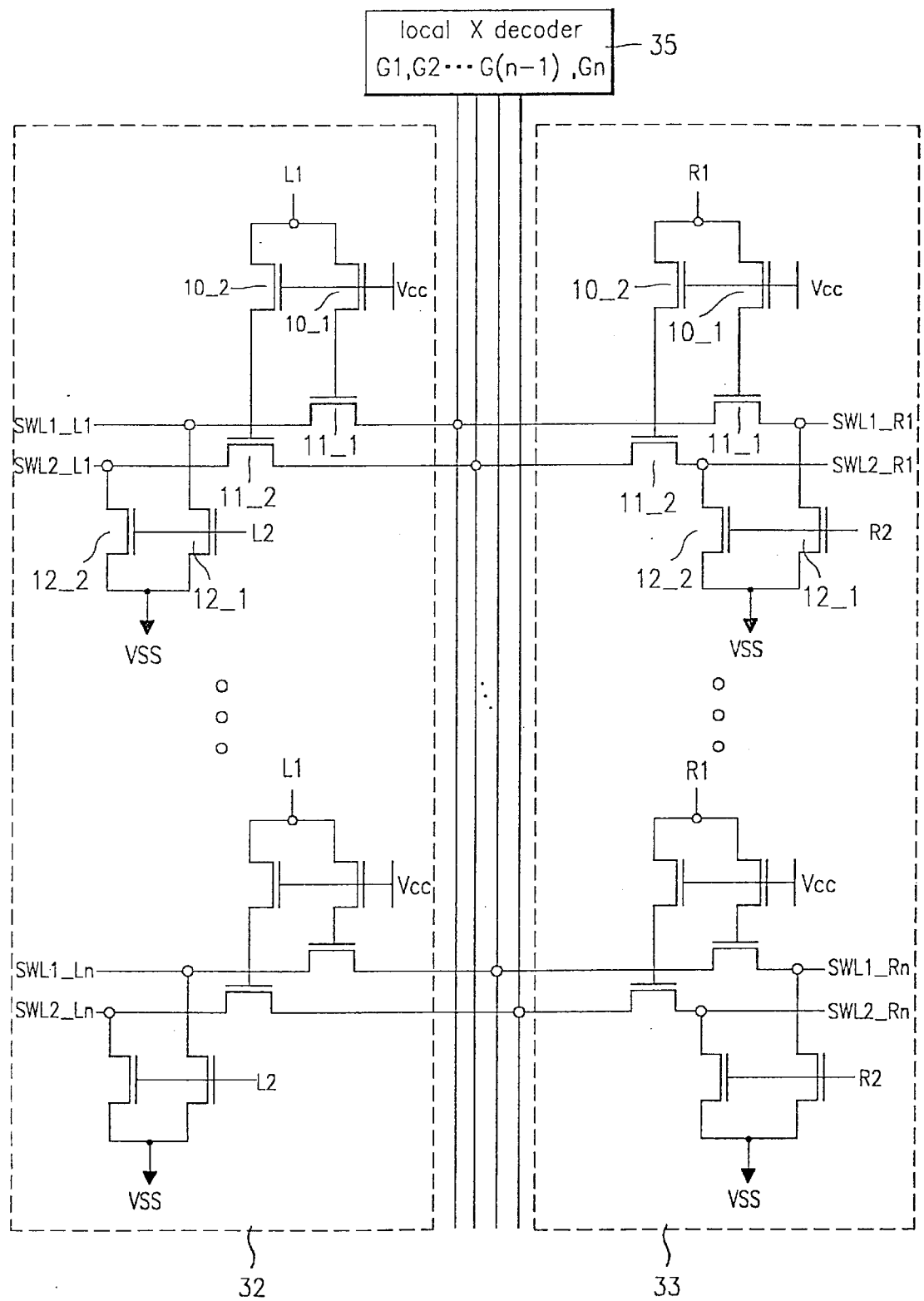
FIG. 12 is a circuit diagram showing first and second local wordline drivers of FIG. 11.

FIG. 12 is a circuit diagram showing the first and second local wordline drivers 32 and 33 of FIG. 11. When L1 and L2 are active as shown in FIG. 12, a unit circuit of the first local wordline driver 32 includes first switching elements 10_1 and 10_2 for switching the first control signal L1 output from the first main wordline driver 30, second switching elements 11_1 and 11_2 controlled by the first control signal L1 transmitted through the first switching elements 10_1 and 10_2 to switch output signals G1 and G2 of the first local X decoder 35, and third switching elements 12_1 and 12_2 controlled by the second control signal L2 to provide the output signals G1 and G2 of the local X decoder 35 transmitted through the second switching elements 11_1 and 11_2 to a first split wordline SWL1_L1 and a second split wordline SWL2_L1, respectively.

The first, second and third switching elements are preferably NMOS transistors. However, the present invention is not intended to be limited to a transistor or two of each of the switching elements or first through third switching elements. The first and second control signals L1 and L2, which are local wordline driver enable signals from the main wordline driver 30, preferably have phases opposite to each other.

When the R1 and R2 are active as shown in FIG. 12, the unit circuit of the second local wordline driver 33 includes first switching elements 10_1 and 10_2 for switching the first control signal R1 output from the main wordline driver 30 to activate the local wordline driver and second switching elements 11_1 and 11_2 controlled by the first control signal R1 transmitted through the first switching elements 10_1 and 10_2 to switch the output signals G1 and G2 of the first local X decoder 35. Third switching elements 12_1 and 12_2 are controlled by the second control signal R2 to provide the output signals G1 and G2 transmitted through the second switching elements 11_1 and 11_2 to a first split wordline SWL1_1 R1 and a second split wordline SWL2_R1, respectively.

The first, second and third switching elements in the second local wordline driver 33 are preferably NMOS transistors. A plurality of circuits of the unit circuit shown in FIG. 12 are preferably formed in the first and second local wordline drivers 32 and 33.

Operations of the first local wordline driver 32 shown in FIG. 12 will now be described. When enabled, the first control signal L1 is at a high level and the second control signal L2 is at a low level. When the first local wordline driver is disabled, the first control signal L1 is at a low level and the second control signal L2 is at a high level. Of the signals from the first local X decoder 35, the G1 signal is at a high level when enabled, and if the L2 signal is at a low level in a state the L1 signal is at a high level, the first split wordline (e.g., SWL1_L1) is enabled to a high level.

The first split wordline SWL_L1 may be disabled to a low level using, for example, two methods. The first method is a case when the G1 signal is at a low level under a state the L1 signal is at a high level and the L2 signal is at a low level. The second method is a case when the first split wordline SWL_L1 is disabled to a low level without prerequisite conditions (e.g., regardless of the G1 signal) when the L1 signal is at a low level and the L2 signal is at a high level.

Further, of the signals from the first local X decoder 35, if the L2 signal is at a low level when the G2 signal is enabled at a high level and the L1 signal is at a high level, the second split wordline SWL2_L1 is enabled to a high level. The second split wordline may be disabled in two methods. A first method is when the G2 signal is at a low level in a state the L1 signal is at a high level and the L2 signal is at a low level. The second method is when the second split wordline is disabled without prerequisite conditions (e.g., regardless of the G2 signal) when the L1 signal is at a low level and the L2 signal is at a high level.

Operations for selection of the cell array units by L1 and L2 will now be described with reference to FIGS. 11–12. Even if the G1 and G2 signals from the first local X decoder are commonly provided to the first local wordline driver unit 32 and the second local wordline driver unit 33, either one of the first and second local wordline driver units 32 and 33 are preferably determined according to the first, second, third and fourth control signals. As described above, the first and second control signals are enable signals for enabling one of the first and second local wordline drivers 32 and 33, and the third and fourth control signals are signals for disabling the other one. Therefore, if the L1 and L2 signals are the first and second control signals, the first local wordline driver unit is selected.

For example, when it is intended to select any one unit cell in the first cell array unit 31, the L1 and L2 are brought into an enabled state, and the R1 and R2 are brought into a disabled state to transfer the first local wordline driver unit 32 into an enabled state. That is, the R1 signal should be brought to a low level, and the R2 signal should be brought to a high level in a state the L1 signal is at a high level and the L2 signal is at a low level.

Operations of the second local wordline driver 33 shown in FIG. 12 will now be described. When the second local wordline driver 33 is enabled, the first control signal R1 is at a high level, and the second control signal R2 is at a low level. When disabled, the first control signal R1 is at a low level, and the second control signal R12 is at a high level. If the R2 signal is at a low level in a state the G1 signal among signals from the first local X decoder 35 is enabled at a high level and the R1 signal is at a high level, the first split wordline SWL1_R1 is enabled to a high level. The first split wordline SWL1_R1 may be disabled to a low level using, for example, two methods. The first method is when the G1 signal is at a low level in a state the R1 signal is at a high level and the R2 signal is at a low level. The second method is when the first split wordline SWL1$_{13}$ R1 is disabled without any prerequisite conditions (e.g., regardless of the G1 signal) in a state the R1 signal is at a low level and the R2 signal is at a high level. Further, if the R2 signal is at a low level, the G2 signal is enabled at a high level and the R1 signal is at a high level, the second split wordline SWL2$_{13}$ R1 is enabled to a high level. The second split wordline may be disabled in two methods. The first method is when the G2 signal is at a low level in a state the R1 signal is at a high level and the R2 signal is at a low level. The second method is when the second split wordline is disabled without any prerequisite conditions (e.g., regardless of the G2 signal) in a state the R1 signal is at a low level and the R2 signal is at a high level.

Operations for selection of the cell array units by R1 and R2 will now be described with reference to FIGS. 11–12. Even if the G1 and G2 signals from the first local X decoder are commonly provided to the first local wordline driver unit 32 and the second local wordline driver unit 33, either one of the first and second local wordline driver units 32 and 33 can be selected according to the first, second, third and fourth control signals. As described above, the first and second control signals from the main wordline driver 30 are enable signals for enabling one of the first and second local wordline drivers 32 and 33, and the third and fourth control signals are signals for disabling the other one. Therefore, if the R1 and R2 signals are the first and second control signals, the second local wordline driver unit is selected.

For example, when it is intended to select any one unit cell in the second cell array unit 34, the R1 and R2 are brought into an enabled state and the L1 and L2 are brought into a disabled state. That is, the L1 signal should be brought to a low level, and the L2 signal should be brought to a high level while the R1 signal is at a high level and the R2 signal is at a low level.

It is necessary to relieve errors, which are generated when a row address is selected, using the nonvolatile ferroelectric memory device according to preferred embodiments of FIGS. 10–12.

A first preferred embodiment nonvolatile ferroelectric memory device with a row redundancy circuit according to the present invention will now be described. The first preferred embodiment of the nonvolatile ferroelectric memory is capable of relieving a row address.

Figure 13:
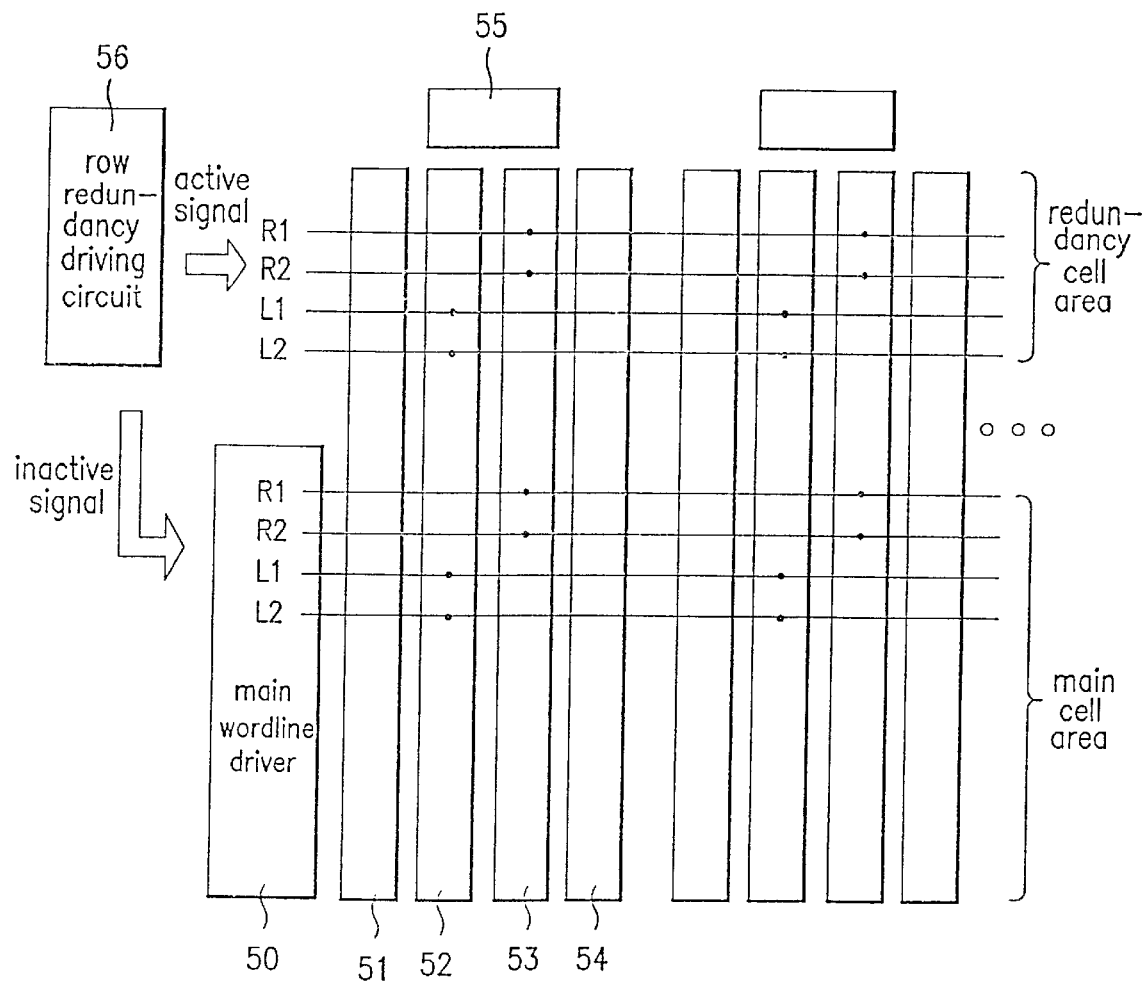
FIG. 13 is a block diagram showing a preferred embodiment of a nonvolatile ferroelectric memory device with a row redundancy circuit according to the present invention.
Figure 14:
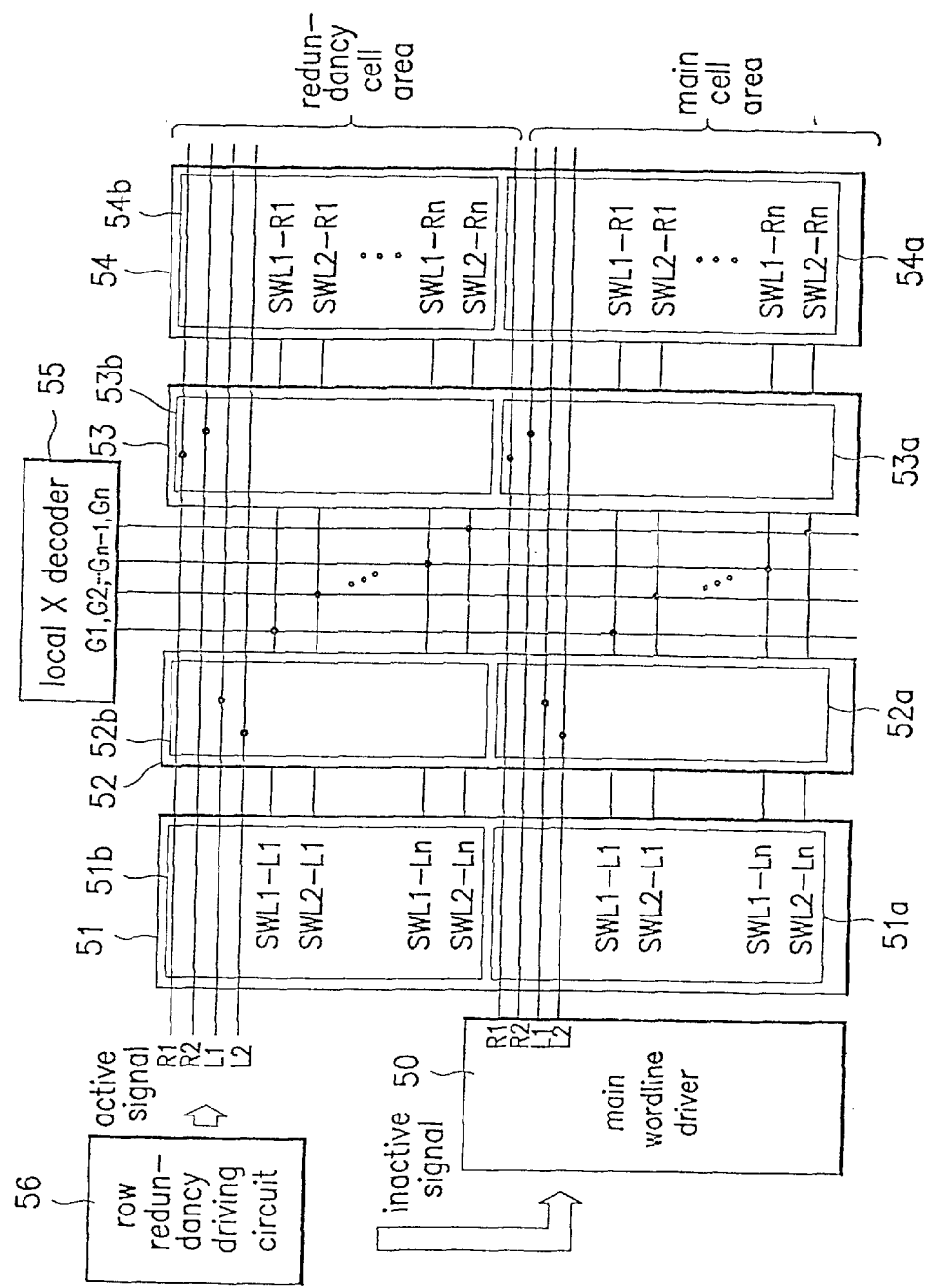
FIG. 14 is a block diagram showing a unit of a preferred embodiment of a nonvolatile ferroelectric memory device with a row redundancy circuit according to the present invention.

FIG. 13 is a block diagram showing the first preferred embodiment of a nonvolatile ferroelectric memory device with a row redundancy circuit according to the present invention. FIG. 14 is a block diagram showing a portion of a nonvolatile ferroelectric memory device with a row redundancy circuit according to the first preferred embodiment.

According to preferred embodiments of the present invention, a nonvolatile ferroelectric memory device with a redundancy circuit may broadly include a main wordline driver, a main cell area, a row redundancy driving circuit, a redundancy cell area, and a local decoder. As shown in FIGS. 13 and 14, the first preferred embodiment of a nonvolatile ferroelectric memory device with a row redundancy circuit includes a main wordline driver 50, first and second cell arrays 51 and 54, first and second local wordline drivers 52 and 53, a local X decoder 55, and a redundancy driving circuit 56.

The main cell area includes first and second cell arrays 51a and 54a and first and second local wordline drivers 52a and 53a. The redundancy cell area includes the row redundancy driving circuit 56, first and second redundancy cell arrays 51b and 54b, and first and second local wordline drivers 52b and 53b. The local X decoder 55 is preferably used in the main cell area and the redundancy cell area.

The first and second cell arrays 51a and 54a and the first and second local wordline drivers 52a and 53a in the main cell area and the local X decoder 55 are similar to those of FIGS. 10–12. Thus, additional detail is omitted here.

The first and second redundancy cell arrays 51b and 54b in the redundancy cell area are preferably similar to the first and second cell arrays 51b and 54a in the main cell area in their configuration. The first and second redundancy local wordline drivers 52b and 53b are also similar to the first and second local wordline drivers 52a and 53a in the main cell area in their configuration.

The redundancy driving circuit 56 in the redundancy cell area acts to output an inactive signal to the main wordline driver 50 of the main cell area when errors occur in selecting a row address of the main cell area, and acts to output control signals L1 and L2 or R1 and R2 for activating the first and second redundancy local wordline drivers 52b and 53b of the redundancy cell area. Thus, if the redundancy cell area becomes active, the main cell corresponding to the activated address preferably becomes inactive.

Figure 15:
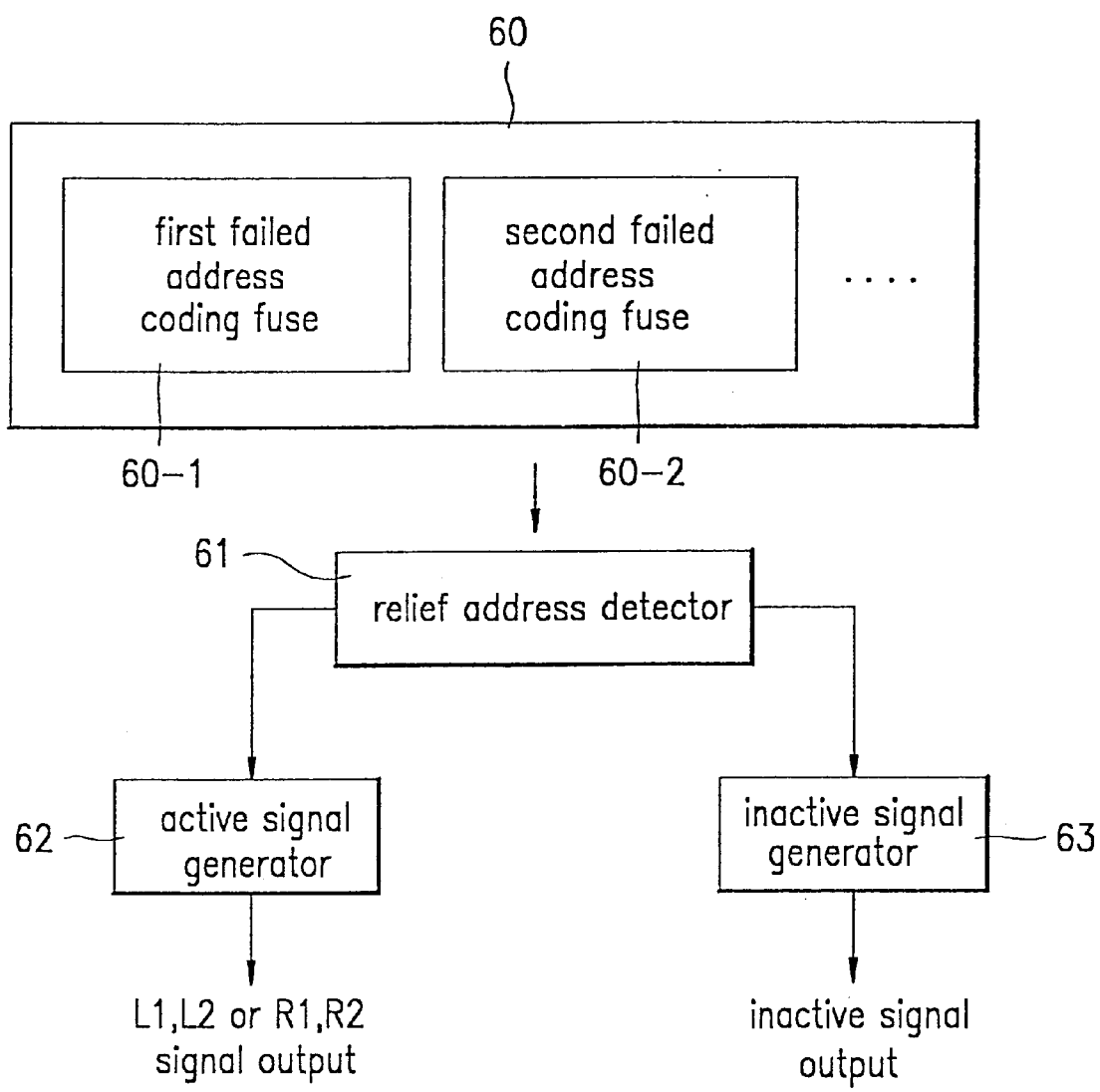
FIG. 15 is a diagram showing a preferred embodiment of a redundancy circuit of FIG. 14.

A preferred embodiment of a row redundancy driving circuit will now be described. As shown in FIG. 15, the row redundancy driving circuit 56 includes a failed address coder 60, a relief address detector 61, an active signal generator 62, and an inactive signal generator 63.

The failed address coder 60 is for coding a failed address in the main cell area to generate a relief address active signal so that the failed address is relieved in the redundancy cell area and the relief address detector 61 is for detecting the relief address active signal to output a relief address signal to a corresponding active signal generator 62 and a corresponding inactive signal generator 63. The active signal generator 62 is for generating the signals L1 and L2 or R1 and R2 to activate the first and second redundancy local wordline drivers 52b and 53b of the redundancy cell area from the relief address signal. The inactive signal generator 63 is for outputting an inactive signal capable of inactivating the first and second local wordline drivers 52a and 53a of the corresponding main cell and the local X decoder 55 so as to inactivate the main cell failed in the main cell area.

The failed address coder 60 preferably includes a plurality of failed address coding fuses 60_1, 60_2, ..., 60–n. Each of the failed address coding fuses can preferably relieve one failed address. Accordingly, the failed address coding fuses are required in equal number to the number of failed addresses.

Figure 16:
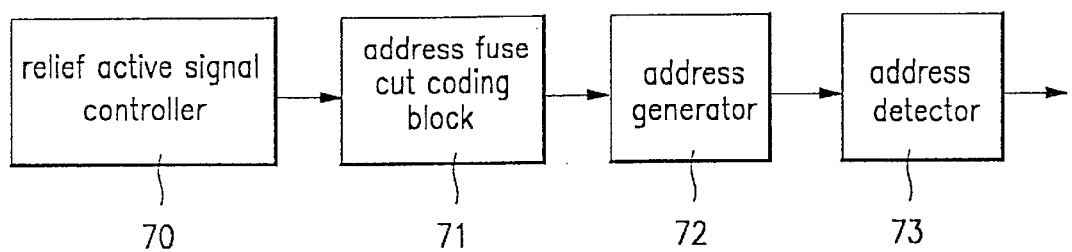
FIG. 16 is a block diagram showing additional detail of a failed address coder of FIG. 15.

The failed address coder will now be described with reference to FIGS. 16 and 17. FIG. 16 is a block diagram that shows a unit failed address coder, and FIG. 17 is a circuit diagram thereof.

Figure 17:
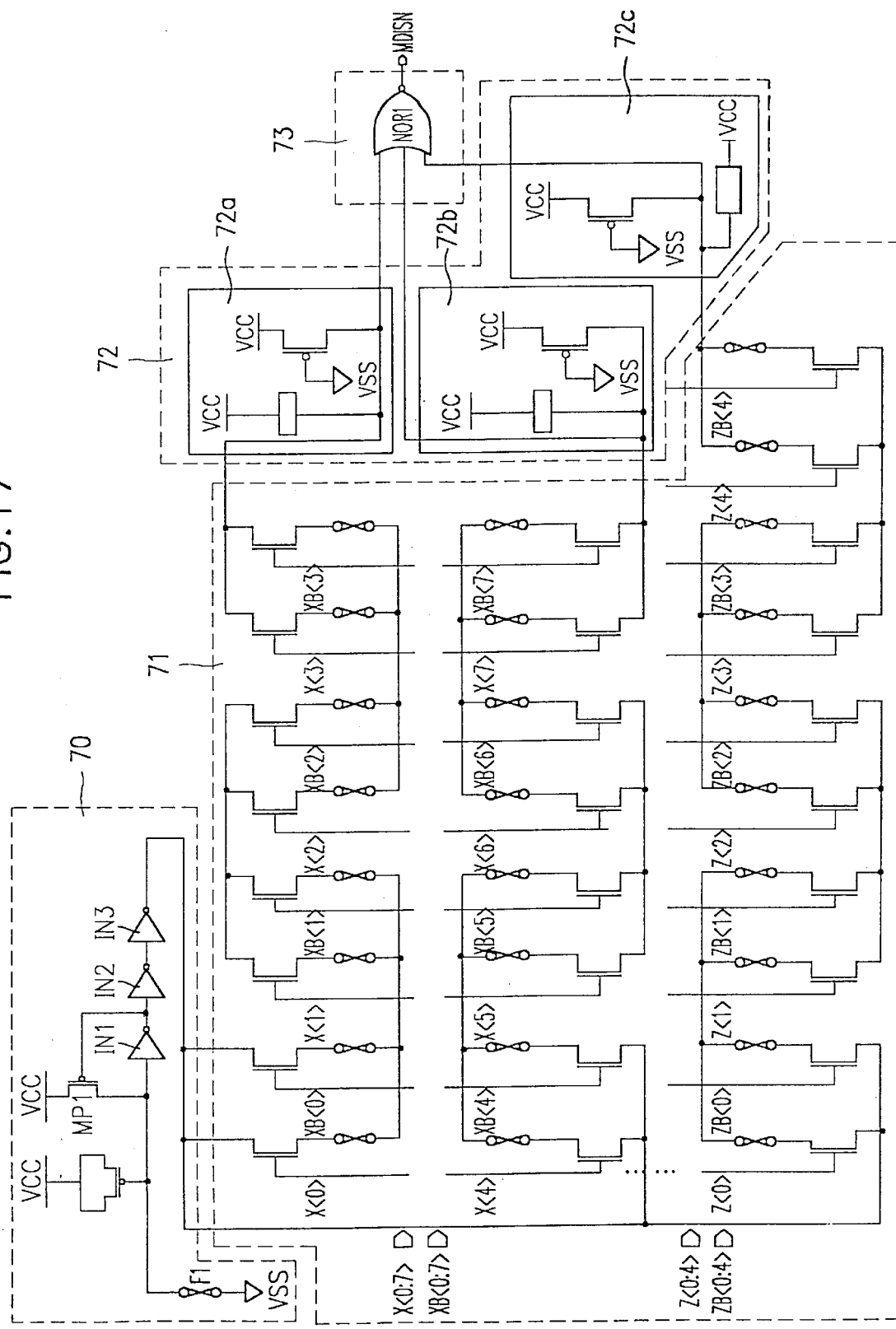
FIG. 17 is a schematic diagram showing a failed address coder of FIG. 16.

As shown in FIGS. 16 and 17, the failed address coder includes a relief active signal controller 70, an address fuse cut coding block 71, an address generator 72, and an address detector 73. The relief active signal controller 70 preferably includes a fuse F1, a pull-up capacitor, first through third inverters IN1, IN2 and IN3 and a first PMOS transistor MP1.

The pull-up capacitor is a PMOS capacitor having one end (e.g., gate terminal) coupled with one end of the fuse F1 and its other end (e.g., source and drain terminal) coupled with a VCC terminal. The first, second and third inverters IN1, IN2 and IN3 are coupled in series to the one end of the fuse F1. The other end of the fuse F1 is coupled with a ground terminal VSS. The first PMOS transistor MP1 is formed between the VCC terminal and the one end of the fuse F1, and an output signal of the first inverter IN1 is applied to a gate terminal of the first PMOS transistor MP1.

The address fuse cut coding block 71 preferably includes a plurality of unit address fuse cut coding blocks. At this time, the unit address fuse cut coding block preferably includes eight NMOS transistors and eight fuses that are respectively coupled in series with each other. In the eight NMOS transistors and fuses) two NMOS transistors and corresponding fuses that are coupled in series with each other constitute one pair. Also, address selection signals (X<0>, XB<0>, ..., X<3>, XB<3>, ..., Z<0>, ZB<0>, ..., Z<3>, ZB<3>, ...) are input to the respective NMOS transistors. Signals of phases opposite to each other are input to the respective pairs of NMOS transistors. Both outer ends of the pairs of the NMOS transistor and the corresponding fuse are coupled together. Further, one or both ends of the respective pairs of the NMOS transistor and the corresponding fuse is coupled with one end of its neighboring transistors.

The address generator 72 includes a plurality of first, second and nth address generators 72a, 72b and 72c. Each of the first, second and nth address generators 72a, 72b and 72c includes one pull-up switch and one PMOS transistor coupled with in parallel with each other. The pull-up switch and the PMOS transistor are coupled to the output terminal of the respective address fuse cut coding block.

The address detector 73 includes a first NOR gate NOR1 that performs logic OR of signals of the respective address generator 72 and inverts them. A relief address signal MDISN is output through the first NOR gate NOR1.

As described above, the respective unit address fuse cut coding blocks each includes first to eighth NMOS transistors and first to eighth fuses. The NMOS transistors and the fuses are one-to-one coupled in series.

As shown in FIG. 17, one end of the first NMOS transistor is coupled with one end of the second NMOS transistor. One end of each of the first to fourth fuses are coupled together. One end of each of the third to sixth NMOS transistors are coupled with one another, and one end of the fifth to eighth NMOS transistors are coupled together. One end of the seventh and eighth NMOS transistors are coupled with an output terminal.

The address signals (X<0>, XB<0>, X<1>, XB<1>, X<2>, XB<2>, X<3>, XB<3>) are input in turn to the NMOS transistors of one unit address fuse cut coding blocks. The first and second NMOS transistors preferably have phases opposite to each other, the third and fourth NMOS transistors have phases opposite to each other, the fifth and sixth NMOS transistors have phases opposite to each other, and the seventh and eighth NMOS transistors have phases opposite to each other.

When a failed address occurs, the fuse F1 of the relief active signal generator 70 is cut. A high signal is applied to one node of the first PMOS transistor MP1 and a low signal is finally output through the third inverter IN3.

The unit address fuse cut coding block preferably maintains the fuse coupled with one of a pair of NMOS transistors to which an address signal failed is applied and cuts the fuse coupled with the other NMOS transistor having the opposite phase. Also, the unit address fuse cut coding block cuts the fuse coupled with one of a pair of NMOS transistors to which an address signal not failed is applied and maintains the fuse coupled with the other NMOS transistor having the opposite phase.

If the relief active signal generator 70 and the address fuse cut coding block are operated as described above, low signal is output to the unit fuse cut coding block when the failed address occurs. If low signal is finally output to the unit fuse cut coding block, high signal is applied to the address detector 73 including the first NOR gate NOR1, so that the failed address is detected.

The relief address detector and the active signal generator, and the inactive signal generator in the row redundancy driving circuit 56 of FIG. 14 will now be described.

Figure 18:
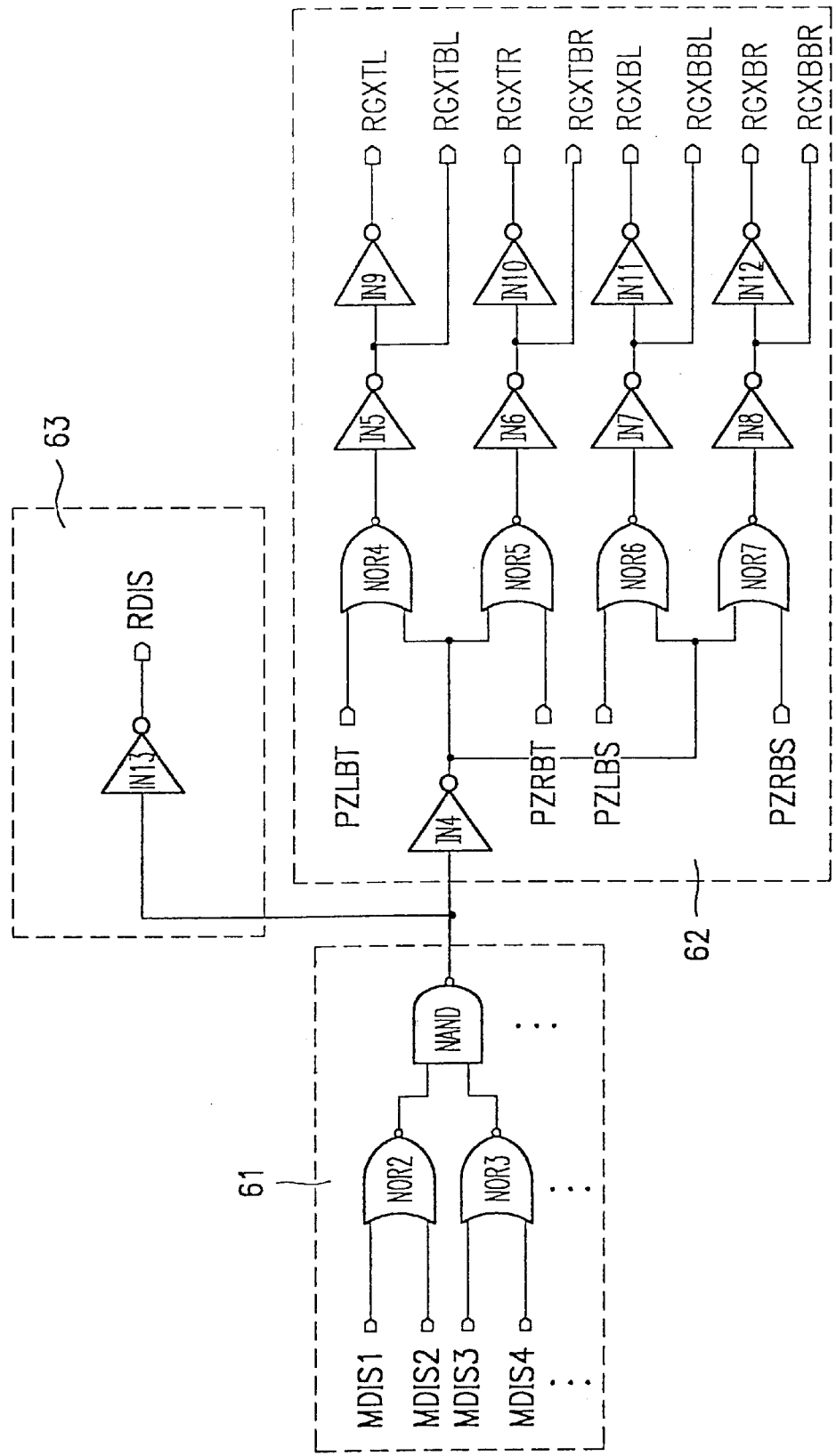
FIG. 18 is a circuit diagram showing additional detail of a redundancy address detector, an active signal generator, and an inactive signal generator of FIG. 15.

As shown in FIG. 18, a plurality of relief address signals MDIS1, MDIS2, MDIS3, MDIS4, . . . , MDISN are applied from the failed address coder 60 to the relief address detector 61. If there is at least one high signal in the applied relief address signals, high signal is output. As shown in FIG. 18, four relief address signals MDIS1, MDIS2, MDIS3, MDIS4 are applied to the relief address detector.

The relief address detector 61 includes second and third NOR gates NOR2 and NOR3 and a NAND gate. The second and third NOR gates NOR2 and NOR3 perform logic OR of the relief address signals MDIS1 and MDIS2 and logic OR of the relief address signals MDIS3 and MDIS4, respectively, and then invert the resultant values. The NAND gate performs logic AND of the respective signals of the second and third NOR gates, and then inverts the resultant values.

The active signal generator 62 includes a fourth inverter IN4 for inverting a signal of the NAND gate of the relief address detector 61, a fourth NOR gate NOR4 for performing logic OR of a first external control signal PZLBT and an output signal of the fourth inverter IN4 and then inverting the resultant values. A fifth NOR gate NOR5 performs logic OR of the output signal of the fourth inverter IN4 and a second external control signal PZRBT, and a sixth NOR gate NOR6 performs logic OR of a third external control signal PZLBS and the output signal of the fourth inverter IN4 and then inverts the resultant values. A seventh NOR gate NOR7 is for performing logic OR of a fourth external control signal PZRBS and the output signal of the fourth inverter IN4 and then inverting the resultant values. Fifth to eighth inverters IN5~IN8 respectively invert signals of the fourth to seventh NOR gates, and ninth to twelfth inverters IN9~IN12 respectively invert signals of the fifth to eighth inverters IN5~IN8.

At this time, signals RGXTL and RGXTBL through the ninth and fifth inverters, signals RGXTR and RGXTBR through the tenth and sixth inverters, signals RGXBL and RGXBBL through the eleventh and seventh inverters, and signals RGXBR and RGXBBR through the twelfth and eighth inverters are finally output. The signals output through the respective pair of inverters have opposite phases and preferably act to control the first and second local wordline drivers.

The inactive signal generator 63 includes a thirteenth inverter IN13 for inverting the signal of the NAND gate of the relief address detector 61. The inactive signal generator 63 outputs an inactive signal RDIS to the main wordline driver.

If there is at least one high signal in the relief address signals applied to the relief address detector 61, the NAND gate outputs high signal to the inactive signal generator 63. The inactive signal generator 63 outputs low signal to inactivate the main wordline driver 50. The active signal generator 62 preferably outputs a control signal to the first and second local wordline drivers by associating respective operators.

A preferred method for relieving a failed address of a memory device according to the present invention will now be described. The preferred embodiment of a method for relieving a failed address in a nonvolatile ferroelectric memory can be used, for example, in the first preferred embodiment of a nonvolatile ferroelectric memory according to the present invention.

Figure 19:
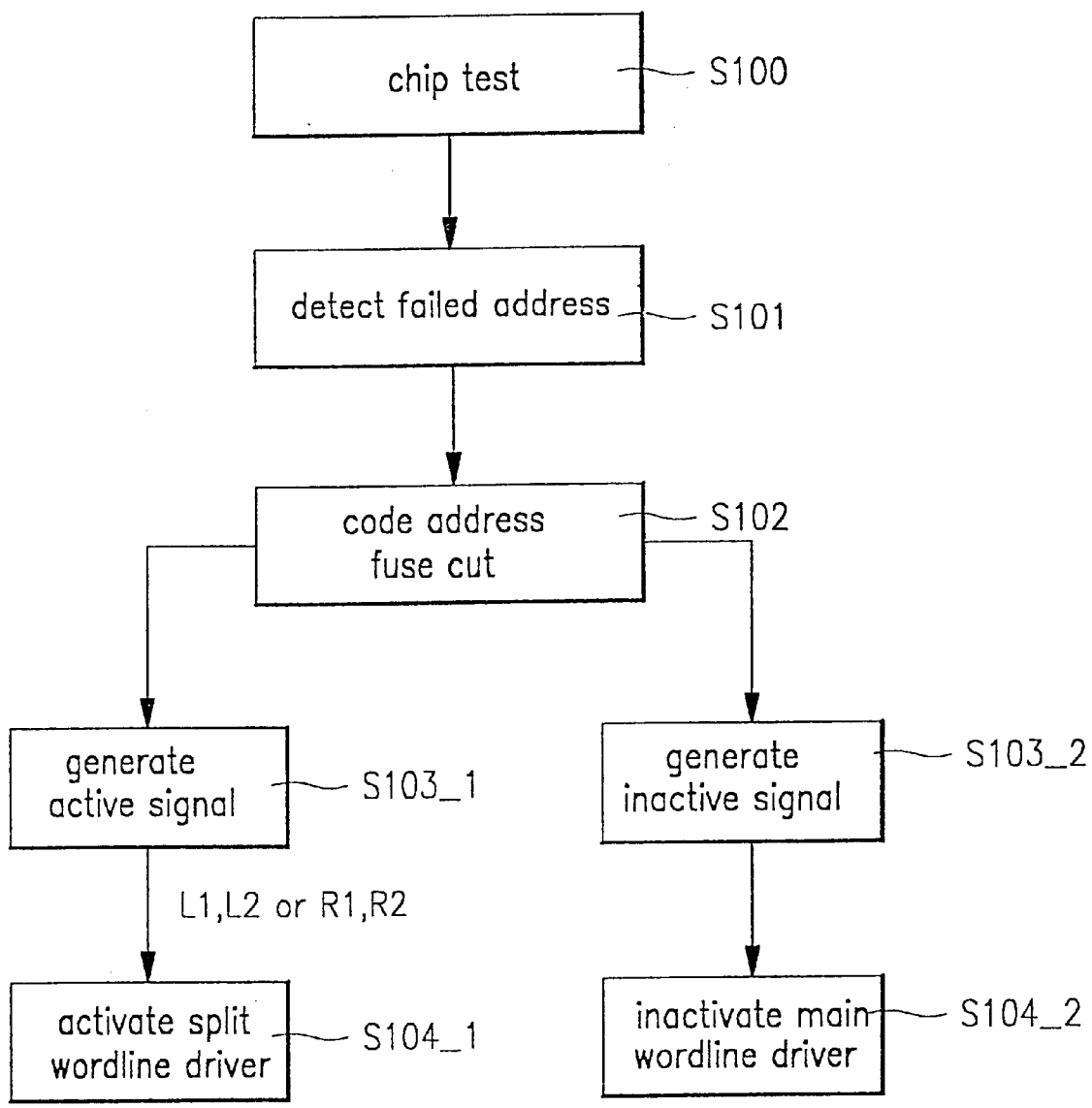
FIG. 19 is a flowchart showing a method for relieving a failed address in a nonvolatile ferroelectric memory device with a row redundancy circuit according to a preferred embodiment of the present invention.

FIG. 19 is a flowchart showing the preferred embodiment of the method for relieving a failed address in a memory device with a row redundancy circuit according to the present invention. As shown in FIG. 19, in step S100 the method for relieving a failed address performs chip test after the wafer process (not shown). From step S100, the process continues to step S101, where a failed address from a poor memory cell of a main cell area is detected. From step S101, control continues to step S102 where an address fuse is cut so that a failed address coder codes a corresponding address to be relieved when a row address is failed. When the failed address is relieved by the row redundancy circuit, control signals L1 and L2 or R1 and R2 are generated in steps S103_1 and S104_1 for driving the first and second local wordline drivers 52b and 53b of the redundancy cell area to drive the first and second local wordline drivers of the first and second cell arrays to activate the split wordlines. Preferably at the same time, an inactive signal is generated for the main wordline driver 50 to inactivate the main wordline driver 50 in steps S103_2 and S104_2, respectively.

Thus, if a row failed address is detected in the main cell area, the row redundancy driving circuit is only driven so as to inactivate the main cell of the corresponding failed address and activate the redundancy cell.

As described above, the nonvolatile ferroelectric memory device with a row redundancy circuit and method for relieving a failed address thereof has various advantages. First, when the row address is failed in the main cell area, the main wordline becomes inactive and only its corresponding row redundancy driving circuit is driven to relieve the failed address, which improves relief efficiency. Since one local X decoder is commonly provided for the redundancy cell area and the main cell area, it is possible to minimize an area of the nonvolatile ferroelectric memory device and improve relief operation speed. Further, the redundancy cell area is the same as the main cell area in its configuration so the configuration efficiency can be increased. In addition, since the fuse address coder of the row redundancy driving circuit can efficiently be designed, a simple layout can be realized, and the overall row relief efficiency can be increased when the simple layout is applied for the split wordline driving circuit.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A nonvolatile ferroelectric memory device, comprising:
   a main cell array including first and second memory arrays each having a plurality of cell arrays;
   first and second local wordline drivers between the first and second memory arrays that respectively output a driving signal for cells of the first and second memory arrays;
   a main wordline driver that provides a main control signal to activate one of the first and second local wordline drivers;
   a redundancy cell array including first and second redundancy memory arrays each having a plurality of cell arrays, wherein the redundancy cell array corrects an error generated when a row address of the main cell array is selected;
   first and second redundancy local wordline drivers that respectively output the driving signal for cells in the first and second redundancy memory arrays;
   a row redundancy driving circuit connected to the main wordline driver to provide an inactive signal to the main wordline driver when the error is generated for the selected the row address of the main cell arrays and further connected to the first and second redundancy local wordline drivers to provide a redundancy control signal to the first and second redundancy local wordline drivers; and
   a decoder connected to the first and second local wordline drivers of the main cell array and the first and second redundancy local wordline drivers of the redundancy cell array to provide the driving signal corresponding to any cell of the main cell array and the redundancy cell array.

2. The nonvolatile ferroelectric memory device of claim 1, wherein each of the plurality of local wordline drivers in the first and second local wordline drivers provides the driving signal to one of a plurality of split wordline pairs.

3. The nonvolatile ferroelectric memory device of claim 1, wherein a cell of the main cell array and the redundancy cell array comprises:
   a first and a second split wordlines extending along one direction at first intervals;
   a first and a second bitlines extending along a second direction to cross the first and second split wordlines at second intervals;
   a first transistor having a second electrode coupled to the first bitline and a control electrode coupled to the first split wordline;
   a first ferroelectric capacitor between a first electrode of the first transistor and the second split wordline;
   a second transistor having a second electrode coupled to the second bitline and a control electrode coupled to the second split wordline; and
   a second ferroelectric capacitor between a first electrode of the second transistor and the first split wordline.

4. The nonvolatile ferroelectric memory device of claim 1, wherein the main wordline driver provides a first and a second control signals to enable one of the first and second local wordline drivers, and a third and a fourth control signals to disable the other one of the first and second local wordline drivers.

5. The nonvolatile ferroelectric memory device of claim 4, wherein when the first and second control signals are provided to the first local wordline driver unit, the third and fourth control signals are provided to the second local wordline driver unit, wherein when the first and second control signals are provided to the second local wordline driver unit, the third and fourth control signals are provided to the first local wordline driver unit, and wherein the first and second control signals have opposite phases.

6. The nonvolatile ferroelectric memory device of claim 4, wherein each of the plurality of local wordline drivers comprises:
   first switches that switch the first control signal among enable signals from the main wordline driver;
   second switches controlled by the first control signal passed through the first switches that switch a corresponding driving signal from the decoder; and
   third switches controlled by the second control signal among the enable signals that selectively provide the corresponding driving signals each to a corresponding split wordline.

7. The nonvolatile ferroelectric memory device of claim 1, wherein the row redundancy driving circuit includes:
   a failed address coder that codes a failed address in the main cell array to generate a correction signal;
   a detector that detects the correction signal generated by the failed address coder to output a redundant address signal;
   an active signal generator that generates a redundant control signal in the first and second redundancy local wordline drivers of the redundancy cell area responsive to the redundant address signal; and
   an inactive signal generator that provides an inactive signal to the main wordline driver responsive to the redundant address signal.

8. The nonvolatile ferroelectric memory device of claim 7, wherein the detector comprises:
   a plurality of NOR gates that logically process corresponding ones of a plurality of correction signals generated in the failed address coder; and
   a plurality of NAND gates that logically process corresponding output signals of the plurality of NOR gates.

9. The nonvolatile ferroelectric memory device of claim 8, wherein when first, second, third and fourth relief signals are output by the failed address coder, the detector comprises:
   a first NOR gate that performs logic NOR of the first and second relief address signals;
   a second NOR gate that performs logic NOR of the third and fourth relief address signals; and
   a NAND gate that performs logic NAND of output signals of the first and second NOR gates.

10. The nonvolatile ferroelectric memory device of claim 7, wherein the active signal generator comprises:
    a first inverter that inverts an output signal of the relief address detector;
    first, second, third, and fourth NOR gates that respectively logically process an output signal of the first inverter and a corresponding one of first, second, third and fourth external control signals;
    second, third, fourth, and fifth inverters that respectively invert output signals of the first, second, third, and fourth NOR gates and output resultant values to the first and second redundancy local wordline drivers of the redundancy cell array; and
    sixth, seventh, eighth, and ninth inverters that respectively invert and output signals of the second, third, fourth, and fifth inverters.

11. The nonvolatile ferroelectric memory device of claim 7, wherein the inactive signal generator comprises a tenth inverter that inverts an output signal of the relief address detector.

12. The nonvolatile ferroelectric memory device of claim 7, wherein the failed address coder includes a plurality of failed address coding circuits that generate a corresponding correction signal to relieve the failed address.

13. The nonvolatile ferroelectric memory device of claim 12, wherein each of the failed address coding circuits comprises:

a relief active signal controller that outputs a first control signal;

an address fuse cut coding block having a plurality of unit address fuse cut coding blocks that disable fuses to code the failed address according to the first control signal;

an address generator that generates an address signal output by the address fuse cut coding block; and an address detector that detects addresses by logically operating output signals of the address generator, and wherein the relief active signal controller comprises:

a fuse that is disabled when an error is generated in a corresponding selected row address in the main cell array;

a first capacitor between one end of the fuse and power source terminal;

first, second and third inverters coupled in series to the one end of the fuse; and a first transistor that is coupled between the power source terminal and the one end of the fuse having a control electrode that receives an output signal of the first inverter.

14. The nonvolatile ferroelectric memory device of claim 13, wherein the address fuse cut coding block comprises a plurality of unit address fuse cut coding blocks that each receive 'n' bit address signals, wherein said each of the unit address fuse cut coding blocks comprises:

first series coupled transistor and fuse; and second series coupled transistor and fuse that is coupled at outer ends to the first series coupled transistor and fuse to form a pair.

15. The nonvolatile ferroelectric memory device of claim 14, wherein said each of the unit address fuse cut coding blocks has 'n' pairs, and wherein two adjacent pairs of the 'n' pairs are coupled together.

16. The nonvolatile ferroelectric memory device of claim 13, wherein the address generator comprises:

a pull-up switch; and a second transistor coupled in parallel with the pull-up switch between the power source terminal and an output terminal of one of the unit address fuse cut coding blocks.

17. The nonvolatile ferroelectric memory device of claim 13, wherein the address detector includes a first NOR gate that logically processes signals of the unit address fuse cut coding blocks.

18. A row redundancy circuit for a memory device, comprising:

a failed address coder that codes a failed address in a main cell area to generate a correction signal;

a detector that detects the correction signal generated by the failed address coder to output a redundant address signal;

an active signal generator that generates a redundant control signal in first and second redundancy local wordline drivers of a redundancy cell area responsive to the redundant address signal; and an inactive signal generator that provides an inactive signal for the main cell area responsive to the redundant address signal.

19. The row redundancy circuit of claim 18, wherein the memory device is a nonvolatile ferroelectric memory device, and wherein each cell of the redundancy cell area comprises:

a first and a second split wordlines extending along one direction at first intervals;

a first and a second bitlines extending along a second direction to cross the first and second split wordlines at second intervals;

a first transistor having a second electrode coupled to the first bitline and a control electrode coupled to the first split wordline;

a first ferroelectric capacitor between a first electrode of the first transistor and the second split wordline;

a second transistor having a second electrode coupled to the second bitline and a control electrode coupled to the second split wordline; and a second ferroelectric capacitor between a first electrode of the second transistor and the first split wordline.

20. A method for relieving a failed address of a nonvolatile ferroelectric memory device with a row redundancy circuit, wherein the nonvolatile ferroelectric memory has a main cell array and a redundant cell array, comprising:

performing chip test after a wafer fabrication process;

detecting a failed address of the main cell array;

generating a relief address active signal by disabling an address fuse so that a failed address coder codes a corresponding address responsive to the failed address;

detecting the relief address active signal and transmitting a relief address signal to a corresponding active signal generator and inactive signal generator;

generating a redundant control signal for activating first and second local wordline drivers of the redundancy cell array from the relief address signal so as to activate a redundant split wordline driver; and generating a driving signal in the first and second local wordline drivers of the redundancy cell array and at the same time generating an inactive signal for the main wordline driver.

* * * * *